(12) United States Patent
Von Känel

(10) Patent No.: US 10,163,957 B2
(45) Date of Patent: Dec. 25, 2018

(54) MONOLITHIC CMOS INTEGRATED PIXEL DETECTOR, AND SYSTEMS AND METHODS FOR PARTICLE DETECTION AND IMAGING INCLUDING VARIOUS APPLICATIONS

(71) Applicant: G-ray Switzerland SA, Hauterive (CH)

(72) Inventor: Hans Von Känel, Wallisellen (CH)

(73) Assignee: G-ray Switzerland SA, Hauterive (CH)

( * ) Notice: Subject to any disclaimer, the term of this patent is extended or adjusted under 35 U.S.C. 154(b) by 0 days.

(21) Appl. No.: 15/537,451

(22) PCT Filed: Dec. 21, 2015

(86) PCT No.: PCT/IB2015/002385
§ 371 (c)(1),
(2) Date: Jun. 19, 2017

(87) PCT Pub. No.: WO2016/097850
PCT Pub. Date: Jun. 23, 2016

(65) Prior Publication Data
US 2017/0373110 A1    Dec. 28, 2017

Related U.S. Application Data

(60) Provisional application No. 62/094,188, filed on Dec. 19, 2014, provisional application No. 62/211,958, filed on Aug. 31, 2015.

(51) Int. Cl.
*G01T 1/164* (2006.01)
*H01L 27/146* (2006.01)

(52) U.S. Cl.
CPC .... *H01L 27/14636* (2013.01); *H01L 27/1469* (2013.01); *H01L 27/14634* (2013.01);
(Continued)

(58) Field of Classification Search
CPC .............. G01T 1/247; H01L 27/14612; H01L 27/14658
See application file for complete search history.

(56) References Cited

U.S. PATENT DOCUMENTS 4,905,265 A    2/1990  Cox et al.
9,817,137 B2 * 11/2017  Masuda ................. G01T 1/247
(Continued)

FOREIGN PATENT DOCUMENTS

WO    WO 2011/135432 A1    11/2011

OTHER PUBLICATIONS

Tong et al., "Room temperature SiO2/SiO2 covalent bonding," 2006, Applied Physics Letters, vol. 89, pp. 042110-1 to 042110-3.*
(Continued)

*Primary Examiner* — Kiho Kim
(74) *Attorney, Agent, or Firm* — Da Vinco Partners LLC; John Moetteli

(57) ABSTRACT

Monolithic pixel detectors, systems and methods for the detection and imaging of radiation in the form of energetic particles which may have a mass or be massless (such as X-ray photons) comprise a Si wafer with a CMOS processed readout communicating via implants for charge collection with an absorber forming a monolithic unit with the Si wafer to collect and process the electrical signals generated by radiation incident on the absorber. The pixel detectors, systems and methods are used in various medical, industrial and scientific types of applications.

61 Claims, 8 Drawing Sheets

(52) U.S. Cl.
CPC .. *H01L 27/14659* (2013.01); *H01L 27/14661* (2013.01); *H01L 27/14689* (2013.01); *H01L 2224/83894* (2013.01); *H01L 2924/351* (2013.01)

(56) References Cited

U.S. PATENT DOCUMENTS

| | | | |
|---|---|---|---|
| 2006/0086913 A1* | 4/2006 | Spahn | G01N 23/04 250/580 |
| 2006/0245546 A1* | 11/2006 | Spahn | A61B 6/4233 378/108 |
| 2010/0248399 A1 | 9/2010 | Hsieh | |

OTHER PUBLICATIONS

Rolf Kaufmann: "Singe Photon Imaging—From X-rays to Visible Light", 8th International Meeting on Front-End Electronics, 2011 May 27, 2011, pp. 24-05-11-27-05-11,XPO55257552, Bergamo, Italy pp. 15,16,30.
Deptuch G W et al: "Vertically Integrated Cirucuits at Fermilab" IEEE Transactions on Nuclear Science, IEEE Service Center, New York, NY, US, vol. 57, No. 4, Aug. 1, 2010, pp. 2178-2186, XPO11312353, ISSN: 0018-9499 the whole document.
International Search Report of International Patent Application No. PCT/IB2015/002385, dated Jun. 23, 2016.

\* cited by examiner

MONOLITHIC CMOS INTEGRATED PIXEL DETECTOR, AND SYSTEMS AND METHODS FOR PARTICLE DETECTION AND IMAGING INCLUDING VARIOUS APPLICATIONS

CROSS REFERENCE TO RELATED APPLICATIONS

This application is the National Stage of International Application No. PCT/IB2015/002385, filed Dec. 21, 2015, which claims benefit under 35 USC § 119(a), to U.S. provisional patent application Ser. No. 62/094,188, filed Dec. 19, 2014 and to U.S. provisional patent application Ser. No. 62/211,958, filed Aug. 31, 2015.

FIELD OF THE INVENTION

The invention relates to pixel detectors made from monolithic, Complementary Metal Oxide Semiconductor (CMOS) integrated structures for the detection and imaging of radiation in the form of energetic particles which may have a mass or be massless, and to methods for forming such structures.

BACKGROUND OF THE INVENTION

Current digital imaging devices for energetic particle detection, also called pixel detectors, can be classified into two broad classes, distinguished by the way in which impacting energy is converted into electrical signals. Taking X-ray photons as an example, in the first one of these classes the conversion happens indirectly in the sense that X-ray photons are first down-converted in energy to visible photons in a scintillation layer. The visible photons are subsequently detected by an array of photodiodes, in which the optical generation of electron-hole pairs gives rise to electrical signals which are then further processed by a readout electronics and represented as an image on a computer screen. The two-stage conversion process of indirect X-ray imaging devices suffers from the drawback of limited conversion efficiency and spatial resolution because of losses and scattering occurring both during the conversion of X-rays into visible photons and in the detection of those. Typically about 25 electron-hole pairs are finally measured by the readout electronics per keV of incident X-ray energy.

In the second class of these pixel detectors semiconductor absorbers permit the direct conversion of X-rays into electron-hole pairs which can then be measured as an electrical signal by a readout electronics. In addition to superior sensitivity and higher spatial and temporal resolution compared to scintillator based indirect conversion, such absorbers offer also spectral resolution, since the energy of an incident X-ray photon is proportional to the number of generated electron-hole pairs and thus measurable by a pulse height analysis. In silicon (Si), one needs on average 3.6 eV to create a single electron-hole pair (see for example R. C. Alig et al. in Phys. Rev. B 22, 5565 (1980); and R. C. Alig in Phys. Rev. B 27, 968 (1983), the entire disclosures of which are hereby incorporated by reference). On average this leads to 280 electron-hole pairs per keV of absorbed X-ray energy, from which it can be seen that the conversion efficiency exceeds that of a scintillator-photodiode combination by more than a factor of ten.

X-ray imaging detectors, or pixel sensors in general, employing direct conversion by means of semiconductor absorbers, can be implemented essentially in two different ways. In the first, an absorber wafer is bonded onto the readout chip in order to realize the connections needed to process the electrical signal from every absorber pixel. The most common bonding technique is bump bonding, as used for example by the Medipix collaboration (http://medipix.web.cern.ch) or by Dectris AG (http://www.dectris.ch). The absorber can in principle consist of any semiconductor material suitable for energetic particle detection from which large crystals can be grown, for example Si, Ge, GaAs and CdTe (see for example European Patent No. 0571135 to Collins et al., the entire disclosure of which is hereby incorporated by reference).

The second implementation of direct X-ray imaging detectors is based on the monolithic integration of the absorber with the readout electronics. Such monolithic pixel sensors with Si absorbers have been developed also for the detection of ionizing radiation other than X-rays in high energy physics. They comprise a high-resistivity absorber layer with a resistivity between about 1 k$\Omega$cm and 8 k$\Omega$cm epitaxially grown on the backside of a standard Si CMOS-wafer. The wafer is subsequently CMOS processed to fabricate the readout electronics on the front side (see for example S. Mattiazzo et al. in Nucl. Instrum. Meth. Phys. Res. A 718, 288 (2013), the entire disclosure of which is hereby incorporated by reference). While these devices are very promising for particle detection, absorbers with thicknesses much beyond those of epitaxial layers are needed for X-ray detection. Moreover, absorbers comprising elements with higher atomic number Z than Si ("heavier elements") are more suitable for X-rays with energies above about 40 keV because of their more efficient absorption.

The monolithic integration of single crystal X-ray and particle absorbers from elements with higher Z in a monolithic unit with the Si readout electronics is, however, complicated by materials incompatibility, such as different lattice parameters and thermal expansion coefficients. Commercial devices are therefore based on polycrystalline or amorphous materials and readout circuits with thin film transistors. Such flat panel X-ray imaging detectors from amorphous selenium are already used for medical applications since they offer large size and are relatively inexpensive to make (see for example S. Kasap et al. in Sensors 11, 5112 (2011), the entire disclosure of which is hereby incorporated by reference). Since materials in the form of single crystals offer much better transport properties compared with their polycrystalline and amorphous counterparts, monolithic sensors made therefrom are, however, expected to offer much better performance. On the other hand, the practical realization of such structures has so far been hindered by the material incompatibility issues mentioned above.

There are a number of different ways in which a monolithic pixel sensor from single crystal high-Z materials can possibly be made. One approach is based on direct wafer bonding, wherein the absorber wafer is bonded onto the wafer containing the readout electronics. In practice the readout electronics comprises a CMOS-processed Si wafer. For example hydrophobic bonding may be used in order to assure an electrical connection between the bonded parts, which, however, requires special precautions to avoid hydrogen bubble formation during any low temperature annealing step, such as trench etching, which is ill-suited for detector applications (see for example U.S. Pat. No. 6,787,885 to Esser et al., the entire disclosure of which is hereby incorporated by reference).

In another approach the materials of readout wafer and absorber differ from Si but are essentially the same. It has for example been suggested to enrich Si with a heavier element such as Ge, giving rise to a SiGe alloy. An imaging and particle detection system based on bulk-grown $Si_{1-x}Ge_x$ alloys with a Ge content below 20% has been disclosed in the International Patent Application No. WO 02/067271 to Ruzin, the entire disclosure of which is hereby incorporated by reference. In this proposed approach readout electronics and absorber are thus both fabricated in the same SiGe wafer. It requires, however, large SiGe wafers of sufficient quality to become available.

In yet another approach the absorber is epitaxially grown directly onto the CMOS-processed wafer containing the readout electronics. This has been disclosed for the example of an epitaxial Ge absorber in U.S. Pat. No. 8,237,126 to von Känel, the entire disclosure of which is hereby incorporated by reference. The large mismatch of lattice parameters of about 4.2% and thermal expansion coefficients of Ge and Si of about 130% near room temperature are highly problematic, however, since they result in high defect densities (such as misfit and threading dislocations and stacking faults), wafer bowing and layer cracks, all of which are serious obstacles in the way of producing an efficient device. Another difficulty with this approach is the limited temperature budget to which the CMOS readout circuits can be exposed. Typically, with standard aluminium metallization temperatures have to be kept below 450° C. This is too low for high-quality Ge epitaxy to be maintained to the layer thicknesses of dozens of micrometers needed for efficient absorption of high-energy X-ray photons. The only way to deposit thick Ge-layers in a backend process appears hence to exist through the use of a modified, temperature resistant metallization, for example a tungsten metallization as offered by some companies.

For reasons of manufacturing costs, scaling to large area absorber wafers, suitable for example for the fabrication of flat panel detectors, is highly desirable irrespective of the design details of a pixel detector. As Si wafers of excellent quality are readily available with sizes of 300 mm and beyond, the use of thick epitaxial layers of high-Z materials on Si substrates appears to be an attractive alternative to bulk crystal growth. The epitaxial growth of most compound semiconductors is, however, even more difficult than that of Ge since in addition to the lattice and thermal mismatch one faces the problem of anti-phase domain formation because of different step heights of substrate and epilayer. For what concerns the application in X-ray imaging detectors these problems have been largely ignored (see for example European Patent Application No. 1 691 422 to Yasuda, the entire disclosure of which is hereby incorporated by reference).

The problem of wafer bowing and layer cracking has been solved by a method involving deep Si-substrate patterning at a micron-scale, along with far-from-equilibrium epitaxial growth, giving rise for example to space-filling Ge-crystals separated by tiny gaps (see for example International Patent Application No. WO 2011/135432 to von Känel, the entire disclosure of which is hereby incorporated by reference). For sufficiently large aspect ratio of the crystals for faceted surfaces, the method leads furthermore to the expulsion of all threading dislocations, so that crystal regions at a distance of several microns from the interface are entirely defect-free (see for example C. V. Falub et al. in Sci. Rpts. 3, 2276 (2013), the entire disclosure of which is hereby incorporated by reference). In a modification of the detector concept of U.S. Pat. No. 8,237,126 to von Känel (see Kreiliger, Physica Status Solidi A 211, 131-135 (2014), the entire disclosure of which is hereby incorporated by reference) the Ge-absorber, consisting of isolated, densely spaced Ge-crystals, is located on the back-side of a Si-wafer on the front-side of which the readout electronics has been incorporated by CMOS-processing. The electron-hole pairs generated within the Ge-absorber therefore need to be separated and, depending on polarity, electrons or holes have to cross the depleted Si/Ge heterojunction (the Si wafer and Ge absorber form a heterojunction diode) and drift through the Si-wafer in order to be collected by implants on the readout side the spacing of which defining the pixel size. The concept has two major drawbacks: (1) the Si/Ge interface necessarily harbours a very high density of misfit dislocations because of the lattice mismatch of 4%. These dislocations act as generation/recombination centers, forming an important contribution to the reverse current of the Si—Ge diode in the dark (see for example Colace et al. in IEEE Photonics Technology Letters 19, 1813 (2007), the entire disclosure of which is hereby incorporated by reference); (2) Pure Ge is not an ideal material for applications in large area detectors because of its low room temperature resistivity of only 50 Ωcm. For this reason Ge detectors have to be cooled typically to liquid nitrogen temperature (see for example U.S. Pat. No. 5,712,484 to Harada and http://www.canberra.com/products/detectors/germanium-detectors.asp, the entire disclosures of which is hereby incorporated by reference).

It is the aim of the invention to provide monolithic pixel sensors based on CMOS processed readout electronics and both lattice and thermally matched as well as mismatched absorber layers without the need of any special high-temperature metallization layers. The combination of readout electronics wafer and absorber wafer in a monolithic unit is provided by an electrically conductive bond obtained by room-temperature covalent bonding. Strong covalent wafer bonding carried out near room temperature are possible for example by means of equipment manufactured by EV Group (see for example C. Flötgen et al. in ECS Transactions 64, 103 (2014), the entire disclosure of which is hereby incorporated by reference). The invention is equally applicable to monolithic pixel detectors with Si absorbers and absorbers made from high-Z materials. In particular, it provides large area monolithic pixel sensors, for example for use in flat panel detectors, even for high-Z absorber materials for which at present no large wafers can be manufactured at a bearable cost. Depending on the application, it is based on the covalent bonding of a thinned Si wafer containing the readout electronics either with a thinned Si wafer acting as absorber, a thinned Si wafer carrying an epitaxial absorber layer, or a thick absorber wafer made from any semiconductor material of high quality.

SUMMARY OF THE INVENTION

It is an object of the invention to provide a monolithic CMOS integrated pixel sensor suitable for high-energy X-ray and particle detection and imaging.

It is another object of the invention to provide a monolithic pixel sensor suitable for high-energy X-ray and particle detection and imaging, wherein the readout electronics and a single crystalline absorber are juxtaposed either on the same or on opposite sides of a CMOS processed silicon wafer.

It is yet another object of the invention to provide a monolithic CMOS integrated pixel sensor suitable for high-energy X-ray and particle detection and imaging which is fabricated by low temperature wafer bonding.

It is another object of the invention to provide a monolithic CMOS integrated pixel sensor suitable for high-energy X-ray and particle detection and imaging which is fabricated by low temperature wafer bonding of a CMOS processed wafer with the readout electronics onto an absorber wafer.

It is a further object of the invention to provide a monolithic pixel sensor suitable for high-energy X-ray and particle detection and imaging which is fabricated by bonding a CMOS processed wafer with the readout electronics onto a substrate with an epitaxial absorber layer.

It is yet a further object of the invention to provide a monolithic pixel sensor suitable for energy-resolved X-ray and particle detection and imaging.

It is yet another object of the invention to provide a monolithic pixel sensor capable of single-photon or single-particle detection.

The invention teaches the structure and fabrication methods of monolithic pixel detectors for the detection and imaging of radiation in the form of energetic particles which may have a mass or be massless (such as X-ray photons). The pixel detectors comprise a Si wafer with CMOS processed readout electronics communicating via charge collectors in the form of implants or metal pads with a single crystalline absorber forming a monolithic unit. This monolithic unit is formed by wafer bonding a CMOS processed Si readout wafer onto an absorber wafer to collect and process the electrical signals generated by radiation incident on the absorber. These and other objects of the invention are described in the drawings, specification and claims.

DETAILED DESCRIPTION OF THE PREFERRED EMBODIMENTS

Figure 1:
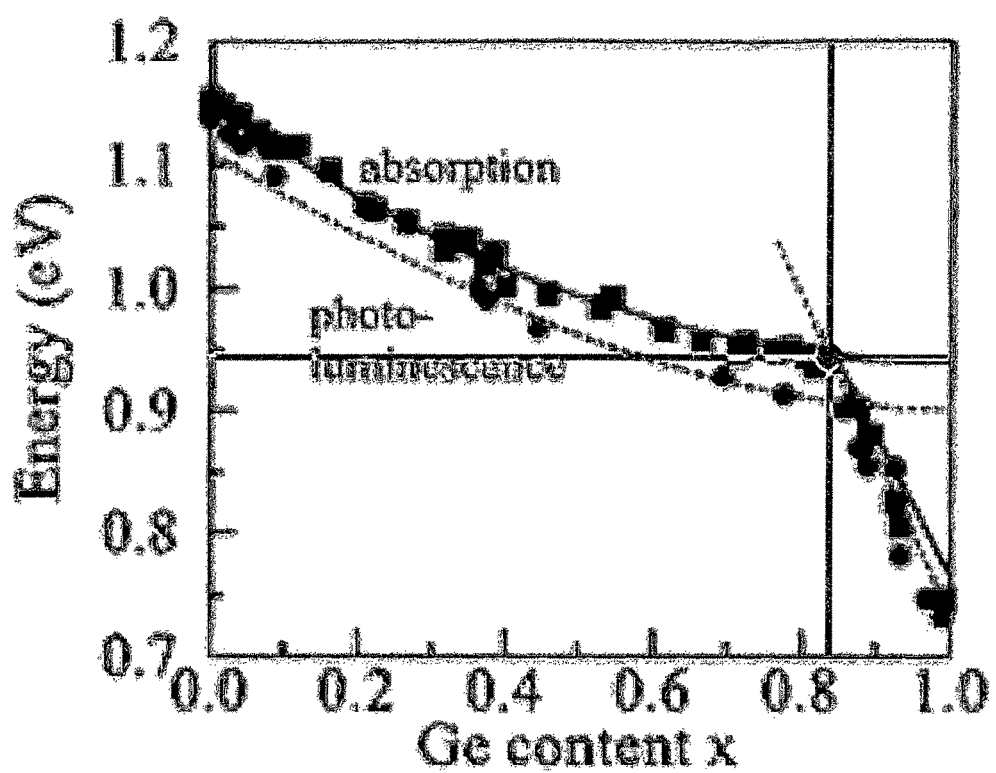
FIG. 1 is a graph showing the dependence of the band gap of $Si_{1-x}Ge_x$ alloys as a function of the Ge content x.

It is the aim of this invention to solve the problems of materials incompatibility preventing the fabrication of sensitive, large area monolithic pixel detectors, such as for example flat panel detectors with sizes for example up to about 20×20 cm² or even about 40×40 cm². For detectors with Si absorbers this incompatibility may consist of highly different doping levels needed for CMOS processed readout wafers and absorber layers. Typically, wafer substrates for CMOS processing have a resistivity up to about 30 Ωcm, whereas absorber layers should preferably have a resistivity above about 500 Ωcm or even more preferably above 1000 Ωcm or as high as 10,000 Ωcm or even up to 30,000 Ωcm, in order to be depleted of charge carriers at relatively low voltages. Especially for detectors suitable for the efficient detection of X-ray photons with energies above about 40 keV the incompatibility is due to the need of employing high-Z materials to enhance the absorption. The invention overcomes these incompatibilities by means of a low-temperature direct wafer bonding techniques, whereby a CMOS processed readout electronics and a single crystal absorber wafer are combined in a detector structure forming a monolithic unit. Efficient charge collection across the bonded interfaces between the CMOS processed readout electronics and the absorber wafer is enabled by high vacuum bonding equipment as manufactured for example by EV Group (see for example C. Flötgen et al. in ECS Transactions 64, 103 (2014), the entire disclosure of which is hereby incorporated by reference). Uninhibited charge collection furthermore requires ex situ and/or in situ surface preparation techniques providing clean, oxide-free surfaces for wafer bonding. The invention is applicable in principle to any absorber material of which large wafers consisting of high quality single crystals are available or may become available in the future, such as for example Si, GaAs, CdTe, CdZnTe and SiGe. Alternatively, the invention is applicable to absorber materials which can be grown epitaxially on large Si wafers, provided they are substantially defect-free, i.e. epitaxial layers of these materials preferably contain dislocation densities below about $10^5$-$10^6$ cm$^{-2}$ or even below about $10^4$-$10^5$ cm$^{-2}$. One preferred class of materials has been identified to be $Si_{1-x}Ge_x$ alloys with a Ge content x between about $0.2 \leq x \leq 0.8$ or even more preferably between about $0.6 \leq x \leq 0.8$. The band structure of $Si_{1-x}Ge_x$ alloys is Si-like with band gaps above 0.9 eV for $0 \leq x \leq 0.8$ according to FIG. 1 (see for example J. Weber et al. in Phys. Rev. B 40, 5683 (1989), the entire disclosure of which is hereby incorporated by reference). These band gaps are large compared to that of Ge amounting to 0.66 eV. The thermal generation of charge carriers will therefore be correspondingly lowered, resulting in a much higher resistivity and hence lower dark current of detectors based on such alloy absorbers. This in turn is expected to greatly relax the cooling requirements for these detectors.

By construction, the monolithic pixel detectors of the invention are expected to offer single-photon or single-particle detection. The monolithic pixel detectors of the invention are therefore suitable also for energy discrimination, whereby the energy of particles incident on the absorber can be measured by employing the pulse height analysis of the electrical pulses processed by the readout electronics.

Figure 2:
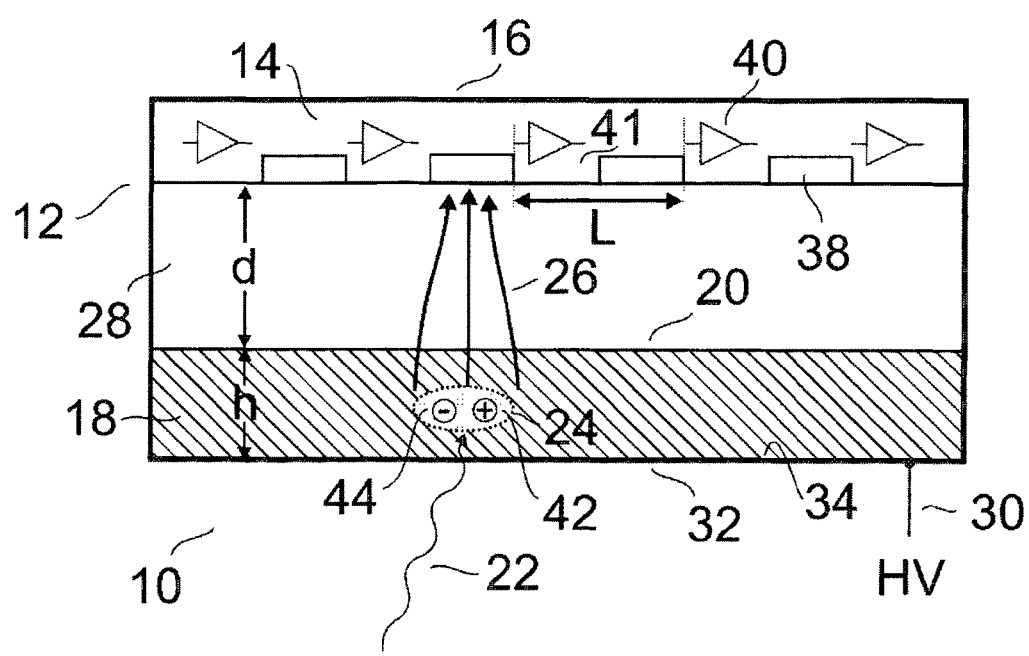
FIG. 2 is a cross-section of a monolithic pixel detector with the absorber on the backside of the wafer and the CMOS processed electronics on the front side.

Referring now to generic embodiment 100 of a monolithic unit comprising a monolithic CMOS integrated pixel detector, FIG. 2 shows a cross-section of device 10 consisting of CMOS processed wafer 12 with readout electronics 14 on the front side 16 and absorber 18 on the back side 20. CMOS processed wafer 12 is preferably a Si wafer as known in the art. Absorber 18 is a generic absorber which in embodiments may be an absorber wafer wholly consisting of absorber material in the form of a single crystal. Alternatively, absorber 18 may be a single crystalline absorber layer on an absorber wafer which may be heterogeneous, consisting partly of material acting as a support for the absorber layer and contributing little to the total absorption. X-rays or high energy particles 22 incident on absorber 18 may create electron-hole pairs 24 which may be pulled apart, the individual charges 42, 44 (electrons, holes) drifting towards the front side 16 of wafer 12 and the surface 34 of absorber 18, respectively, when an electric field represented by electric field lines 26 is present in absorber 18 of thickness h and in drift region 28 of Si wafer 12 of thickness d. Depending on the sign of the voltage 30 applied to the metallized back contact 32 of absorber 18, either holes 42 or electrons 44 may drift along the electric field lines 26 towards the front side 16 of wafer 12 to be collected by charge collector implants 38 defining pixels 41 of the detector of size L. The pixel size L may be in the range of about 5-200 μm, the preferred value depending on the application. For computed tomography (CT) and other medical applications the preferred pixel size may for example be in the range of 100-200 μm or 50-100 μm. For non-destructive testing (NDT) applications the preferred pixel size may for example be in the range of 50-100 μm. For nuclear particle detection L may preferably be about 20-50 μm. For electron detection in transmission electron microscopy (TEM) and secondary ion mass spectroscopy (SIMS) L may preferably be in the range of about 5-25 μm. The electrical signals induced by the charges 42 or 44 collected by charge collector implants 38 may subsequently be processed into digital signals by local readout circuits 40 for pixels 41 comprising readout electronics 14. It is understood that device 10 communicates for example with a PCB board designed for signal routing, further processing and for communicating with data collection, manipulation and display units as known in the art. It is advisable to keep the thickness d of drift region 28 low in order to limit voltage 30 required for its depletion along with the depletion of absorber 18. Full depletion of both regions 18 and 28 are desirable in order to avoid carrier collection by diffusion and to maximize the sensitivity of device 10. Preferably, the thickness d is in the range of 10-100 μm or more preferably about 10-50 μm or even more preferably about 10-20 μm. The optimum thickness h of absorber 18 depends on the absorber material and the energies of the particles to be detected. It may range from about 20 μm to 200 μm or from 200 μm to 1 mm or even to several mm. In general, the extent of depletion of absorber 18 depends on the operating temperature of device 10, the resistivity of the absorber material and the applied voltage 30. It is therefore preferable to keep the room temperature resistivity of the absorber as high as possible in order to limit voltage 30. For Si absorbers the resistivity may be about 5,000-10,000 Ωcm or 10,000-20,000 Ωcm or even 20,000-30,000 Ωcm. For SiGe absorbers the numbers may be comparable to those of Si as long as the Ge content is kept below about 80%, such that the band structure is Si-like. For Cr compensated GaAs the room temperature resistivity may be even higher, for example as high as $2.5 \times 10^9$ Ωcm (see for example M. C. Veale et al. in Nucl. Instr. Meth. Phys. Res. A 752, 6 (2014), the entire disclosure of which is hereby incorporated by reference). CdTe absorbers and $Cd_{1-x}Zn_xTe$ alloy absorbers for example with x=0.1 may have resistivities of about $10^9$ and $10^{10}$ Ωcm, respectively (see for example S. Del Sordo et al., in Sensors 9, 3491 (2009), the entire disclosure of which is hereby incorporated by reference).

One of the advantages of the monolithic CMOS integrated detectors of the invention is their scalability to large areas as required for example for flat panel detectors which may assume a size of 20×20 cm$^2$ or even larger sizes up to about 40×40 cm$^2$.

Another advantage of the monolithic CMOS integrated detectors of the invention is their ability to provide single-photon or single-particle detection. This ultimate limit of detector sensitivity is the consequence of much better electric transport properties (high carrier mobilities, absence of traps and recombination centers) of the single crystalline absorbers of the invention, compared to those typical of the polycrystalline or amorphous absorbers known in the art.

Yet another advantage of the monolithic CMOS integrated detectors of the invention is their ability to provide energy resolution of the detected mass-less photons and of elementary particles with a mass.

Figure 3:
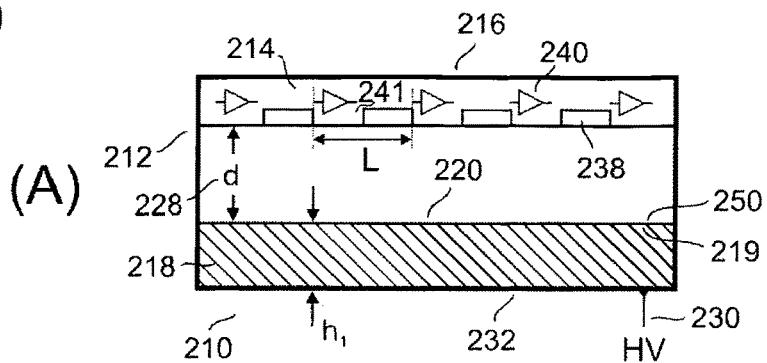
FIG. 3A is a cross-section of a monolithic pixel detector with a bonded absorber crystal on the back of a CMOS processed readout electronics.
FIG. 3B is a cross-section of a monolithic pixel detector with a pixelated absorber crystal bonded to the back of a CMOS processed readout electronics.
FIG. 3C is a cross-section of a monolithic pixel detector with a substrate with an epitaxial absorber layer bonded to the back of a CMOS processed readout electronics.
FIG. 3D is a cross-section of a monolithic pixel detector with a substrate with a pixelated epitaxial absorber layer bonded to the back of a CMOS processed readout electronics.
Figure 3:
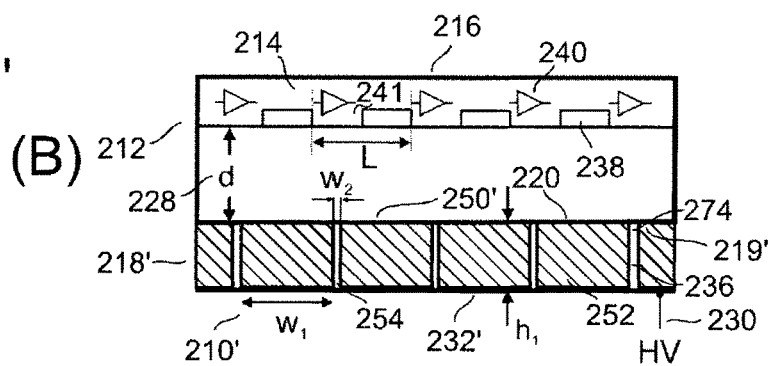
Figure 3:
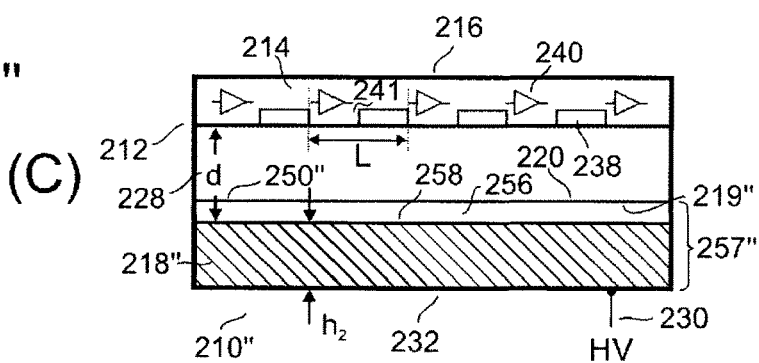
Figure 3:
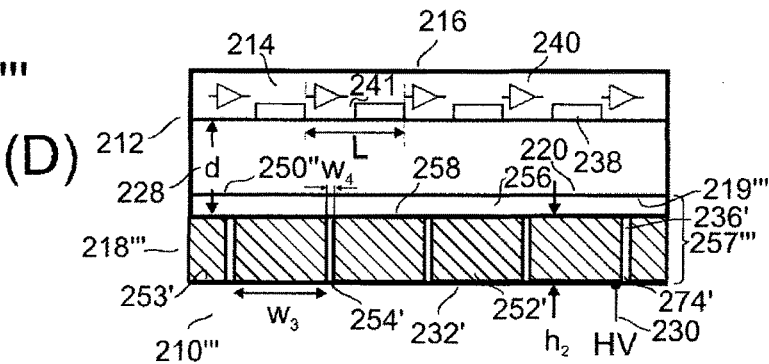

Referring now to FIG. 3A, a first embodiment 200 of monolithically integrated pixel detector 210 comprises a CMOS processed wafer 212 with readout electronics 214 on its front side 216 and an absorber wafer 218 bonded by low temperature wafer bonding onto its back side 220. Embodiment 200 may be suitable especially for absorber wafer 218 made from Si or from materials the thermal expansion coefficients α of which do not deviate strongly from that of Si, such that the thermally induced strain for moderate temperature changes of example 300° C. is below about $10^{-4}$. For example for SiC the mismatch of thermal expansion coefficients $(\alpha_{SiC} - \alpha_{Si})/\alpha_{Si}$ amounts to about 8% at room temperature, yielding a thermal strain $\varepsilon_{th}$ of about $6\times10^{-5}$ for a temperature change $\Delta T$ of 300° C. Embodiment 200 may be applicable also to absorber wafers 218 which are thermally mismatched with Si, such as for example Ge, GaAs, CdTe and $Cd_{1-x}Zn_xTe$ alloys for all of which the mismatch is above 120%, provided that the wafer bonding is carried out at low temperature. The temperatures used for the bonding process are therefore preferably chosen to be below 400° C., or more preferably below 300° C. and even more preferably below 200° C. The most desirable temperatures are below 100° C. or even room temperature. A temperature change by 100° C. results in a thermal strain $\varepsilon_{th}$ of only about $3\times10^{-4}$ for Ge/Si, GaAs/Si, Ge/Si and CdTe/Si bonds, while for a $\Delta T$ of 300° C. $\varepsilon_{th}$ is about $10^{-3}$. Single crystalline absorber wafer 218 is bonded by direct wafer bond 250 to the backside surface 220 of CMOS processed wafer 212. Direct wafer bond 250 between backside surface 220 of wafer 212 and surface 219 of absorber wafer 218 is preferably a covalent bond, providing an electrically conducting contact, preferably with few or no interface states and no oxide between absorber wafer 218 and drift region 228 across the entire backside surface 220 of wafer 212. Preferably, thickness d of drift region 228 is in the range of 10-100 μm or more preferably about 10-50 μm or even more preferably about 10-20 μm. In order for an intimate electrical contact to be established the backside surface of wafer 212 and the bonding surface of absorber wafer 218 have to be atomically flat and particle-free. It may be advisable to subject backside surface 220 of wafer 212 and the bonding surface 219 of absorber wafer 218 to a chemical-mechanical polishing step prior to the surface treatment required for covalent bonding. The bonding process may comprise steps of optional in situ pre-bonding annealing in the bonding apparatus to reduce moisture before any in situ surface treatment providing oxide-free surfaces suitable for covalent bonding. Annealing temperatures may range between 100° C. and 200° C., or between 200° C. and 300° C. The surface treatment required for covalent bonding may include ex situ (outside the bonding apparatus) and in situ (inside the bonding apparatus) steps from a list of steps comprising ex situ wet chemical oxide removal and hydrogen passivation for example by a dilute HF dip or exposure to HF vapor, followed by in situ soft ion bombardment or laser exposure for removal of adsorbed hydrogen. The preferred method for removal of the hydrogen passivation may be by low energy H or He ion bombardment. He ions with energies between about 100-200 eV are known to remove H without any significant recoil implantation (see for example M. R. Tesauro et al. in Surf. Sci. 415, 37 (1998), the entire disclosure of which is hereby incorporated by reference) and much higher energies are required to induce Si amorphization (see for example V. F. Reutov et al, in Techn. Phys. Lett. 28, 615 (2002), the entire disclosure of which is hereby incorporated by reference). Another way for in situ surface oxide removal may be energetic, preferably rare gas or nitrogen particle bombardment (sputtering) for example by charged $Ar^+$, $N_2^+$ and $N^+$ ions or neutral Ar or N atoms or $N_2$ molecules generated for example in a plasma source known in the art. Preferably ion or atom sputtering energies are kept low, for example close to the sputter threshold in order to minimize Si amorphization. Suitable ion and neutral particle energies may range between about 70-100 eV or preferably between about 50-70 eV or even more preferably between about 40-50 eV (see for example S. S. Todorov et al. in Appl. Phys. Lett. 52, 365 (1988), the entire disclosure of which is hereby incorporated by reference).

Covalent bonding, resulting in an electrically conducting bond, is preferably carried out below 400° C. or more preferably below 300° C. or even more preferably below 200° C. The most desirable bonding temperature is below 100° C. or even room temperature. The covalent bonding may be followed by optional post-bonding annealing at annealing temperatures between 100° C. and 200° C., or between 200° C. and 300° C., or between 300° C. and 400° C. In any case temperatures must be below about 450° C. in order to avoid disintegration of the metallization of CMOS processed wafer 212.

The absorber wafer is provided with metallized back contact 232. When a large voltage 230 is applied between contact 232 and charge collector implants 238, resulting substantially in the depletion of absorber wafer 218 and drift region 228 of CMOS processed wafer 212, electron-hole pairs generated by absorbed high energy material particles or photons are separated in the associated electric field and travel along the electric field lines 26 rather than by diffusive transport. Depending on the sign of voltage 230, either electrons or holes are collected by charge collector implants 238 and metal electrode 232. The size of pixels 241 of monolithically integrated pixel detector 210 is thereby defined by the spacing L of implants 238.

Referring now to FIG. 3B, the second embodiment 200' of monolithically integrated pixel detector 210' comprises a CMOS processed wafer 212 with readout electronics 214 on its front side 216 and a pixelated absorber wafer 218' bonded by low temperature wafer bonding onto its back side 220. Embodiment 200' may be of suitable especially for absorber wafers 218' which are lattice matched but thermally mismatched with Si, such as for example GaP, for which the lattice parameter mismatch $(a_{GaP} - a_{Si})/a_{Si}$ is about $3.5\times10^{-3}$ and the mismatch of the thermal expansion coefficient $(\alpha_{GaP} - \alpha_{Si})/\alpha_{Si}$ about 81%. To a lesser extent it may be applicable also to absorber wafers 218' which are thermally and lattice mismatched with Si, such as for example Ge, GaAs, CdTe, CdZnTe and SiC, where the lattice parameter mismatch is about 4.2% for the first two and about 19% for the last three materials. Except for SiC the mismatch of the thermal expansion coefficients is about 130% for these materials. Pixelated absorbers, including Si absorbers, have the additional benefit of improved spatial resolution because charge carriers cannot spread as much on their way to the charge collectors. Absorber wafer 218' is pixelated, i.e. it consists of distinct absorber patches 252 of width $w_1$, separated by trenches 254 of width $w_2$. Sidewalls 274 of absorber patches 252 are preferably passivated by first dielectric layer 236, optionally followed by further dielectric layers, to prevent surface leakage along sidewalls 274 when detector 210' is in operation. The width $w_1$ of distinct absorber patches 252 may be larger, equal or smaller than the pixel size L defined by charge collector implants 238. Width $w_1$ may hence range between about 200-500 am or between about 100-200 µm or between 50-100 µm. The width is preferably chosen in accordance with the size of the thermal mismatch in order to avoid the formation of thermal cracks during the bonding process or during an optional post-bonding anneal. The width $w_2$ of trenches 254 is preferably smaller than the width $w_1$ of distinct absorber patches 252 or even more preferably much smaller. The width $w_2$ of trenches 254 may be as narrow as the minimum width achievable by the lithography and deep reactive ion etching techniques known in the art, such as for example 1-5 µm or even 0.1-1 µm (see for example X. Li et al., in Sensors and Actuators A87, 139 (2001) and E. H. Klaassen, in Sensors and Actuators A52, 132 (1996), the entire disclosures of which are hereby incorporated by reference). Preferably backside surface 220 of CMOS processed wafer 212 and surface 219' of absorber wafer 218' with absorber patches 252 are bonded by covalent direct wafer bonds 250' providing an intimate, electrically conducting contact, preferably with few or no interface states and no oxide between absorber wafer 218' and drift region 228 across the entire backside 220 of wafer 212. Preferably, thickness d of drift region 228 is in the range of 10-100 µm or more preferably about 10-50 µm or even more preferably about 10-20 µm. In order for an intimate electrical contact to be established the backside surface of wafer 212 and the bonding surface of absorber wafer 218' have to be atomically flat and particle-free. It may be advisable to subject backside surface 220 of wafer 212 and the bonding surface of absorber wafer 218' to a chemical-mechanical polishing step prior to the surface treatment required for covalent bonding. The bonding process preferably comprises steps of optional in situ pre-bonding annealing to reduce moisture before any in situ surface treatment providing oxide-free surfaces suitable for covalent bonding. Annealing temperatures may range between 100° C. and 200° C., or between 200° C. and 300° C. Patterning of absorber wafer 218' into absorber patches 252 is preferably carried out after an optional low temperature post-bonding anneal in order to avoid stress exerted during the post-bonding anneal because of different thermal expansion coefficients of wafer 212 and absorber wafer 218'. The surface treatment required for covalent bonding may include steps from a list of steps comprising ex situ wet chemical oxide removal and hydrogen passivation for example by a dilute HF dip or exposure to HF vapor, followed by in situ soft ion bombardment or laser exposure for removal of adsorbed H. The preferred method for removal of the hydrogen passivation may be by low energy H or He ions. He ions with energies between about 100-200 eV are known to remove H without any significant recoil implantation (see for example M. R. Tesauro et al. in Surf. Sci. 415, 37 (1998), the entire disclosure of which is hereby incorporated by reference) and much higher energies are required to induce Si amorphization (see for example V. F. Reutov et al, in Techn. Phys. Lett. 28, 615 (2002), the entire disclosure of which is hereby incorporated by reference). Another way for in situ surface oxide removal may be energetic, preferably rare gas or nitrogen particle bombardment (sputtering) for example by charged $Ar^+$, $N_2^+$ or $N^+$ ions or neutral Ar or N atoms or $N_2$ generated for example in a plasma source known in the art. Preferably ion or atom sputtering energies are kept low, for example close to the sputter threshold in order to minimize Si amorphization. Suitable ion and neutral particle energies may range between about 70-100 eV or preferably between about 50-70 eV or even more preferably between about 40-50 eV (see for example S. S. Todorov et al. in Appl. Phys. Lett. 52, 365 (1988), the entire disclosure of which is hereby incorporated by reference).

Covalent bonding, resulting in an electrically conducting bond, is preferably carried out below 400° C. or more preferably below 300° C. and even more preferably below 200° C. The most desirable bonding temperature is below 100° C. or even room temperature. The covalent bonding may be followed by optional post-bonding annealing. Post-bonding annealing temperatures may range between 100° C. and 200° C., or between 200° C. and 300° C., or between 300° C. and 400° C. In any case they must be below about 450° C. in order to avoid disintegration of the metallization of CMOS processed wafer 212. Absorber wafer 218' is provided with metallized back contact 232'. Distinct absorber patches 252 may therefore be electrically connected by metallized back contact 232' extending substantially across the whole surface of the absorber wafer.

When a large voltage 230 is applied to metallized back contact 232' of absorber wafer 218', resulting substantially in the depletion of absorber wafer 218' and drift region 228 of CMOS processed wafer 212, electron-hole pairs generated by absorbed high energy material particles or photons are separated in the associated electric field and travel along the electric field lines 26 rather than by diffusive transport. Depending on the sign of voltage 230, either electrons or holes are collected by charge collector implants 238, defining the size L of pixels 241, and metal electrode 232'.

Referring now to FIG. 3C, the third embodiment 200" structurally resembles the first embodiment (FIG. 3A) but with the absorber wafer comprising an epitaxial layer on a Si substrate. The third embodiment of monolithically integrated pixel detector 210" consists of CMOS processed wafer 212 with readout electronics 214 on the front side 216 and absorber wafer 257" bonded by low temperature wafer bonding onto the back side 220. Embodiment 200" may be of suitable especially for absorber layers 218" which cannot be grown in the form of large single crystals suitable for wafer fabrication, but which can be grown in the form of epitaxial layers on a large Si substrate 256. Epitaxial absorber layer 218" is preferably made from a semiconductor material which is substantially lattice matched to the Si substrate, such as for example GaP, for which the lattice parameter mismatch $(a_{GaP}-a_{Si})/a_{Si}$ is about $3.5 \times 10^{-3}$, in order to avoid a high density of misfit dislocations to be present at interface 258 between substrate and epitaxial layer. It may also comprise compositionally graded layers, where the layers closest to the interface with the Si substrate are lattice matched, such as $GaP_{1-x}As_x$ alloys with x ranging from 0 to 1 within a thickness of several µm, for example about 3-5 µm or about 5-10 µm, after which the full lattice mismatch of about 4% characteristic of pure GaAs is reached and a thick GaAs cap layer maybe added, for example comprising a thickness of about 10-50 µm or preferably about 50-100 µm or even 100-200 µm. Depending on the grading rate, i.e., the rate at which the composition x is changed as a function of layer thickness, dislocations are distributed over a smaller or larger volume of the graded layer. The smaller the grading rate the lower the density of misfit dislocations per volume fraction of the layer. The density of threading dislocations extending to the growth front of the graded layer is correspondingly reduced with decreasing grading rate, as known by one skilled in the art.

In order to avoid the formation of antiphase boundaries because of different surface step heights of substrate 256 and epitaxial absorber layer 218", substrate 256 may be slightly offcut from the usual exact on-axis wafer orientation which may preferably be (001) oriented, for example by about 2°-4° or even 4°-6° preferably in the [110] direction.

Substrate 256 is preferably thinned before direct wafer bond with CMOS processed wafer 212 is formed. The preferable thickness of thinned substrate 256 is between about 10-100 μm, and more preferably between about 10-50 μm and even more preferably between about 10-20 μm.

In embodiment 200" direct wafer bond 250" is a covalent Si—Si bond between backside 220 of CMOS processed wafer 212 and surface 219" of substrate 256 on which epitaxial absorber layer 218" is grown. In order for an intimate, electrically conducting contact to be established the backside surface 220 of wafer 212 and the bonding surface 219" of substrate 256 have to be atomically flat and particle-free. Preferably, thickness d of drift region 228 is in the range of 10-100 μm or more preferably about 10-50 μm or even more preferably about 10-20 μm. It may be advisable to subject backside surface 220 of wafer 212 and the bonding surface of substrate 256 to a chemical-mechanical polishing step prior to the surface treatment required for covalent bonding. The bonding process preferably comprises steps of optional in situ pre-bonding annealing to reduce moisture before the in situ surface treatment providing oxide-free surfaces suitable for covalent bonding. Annealing temperatures may range between 100° C. and 200° C., or between 200° C. and 300° C. The surface treatment required for covalent bonding may include steps from a list of steps comprising ex situ wet chemical oxide removal and hydrogen passivation for example by a dilute HF dip or exposure to HF vapor, followed by in situ soft ion bombardment or laser exposure for removal of adsorbed H. The preferred method for removal of the hydrogen passivation may be by low energy H or He ions. He ions with energies between about 100-200 eV are known to remove H without any significant recoil implantation (see for example M. R. Tesauro et al. in Surf. Sci. 415, 37 (1998), the entire disclosure of which is hereby incorporated by reference) and much higher energies are required to induce Si amorphization (see for example V. F. Reutov et al, in Techn. Phys. Lett. 28, 615 (2002), the entire disclosure of which is hereby incorporated by reference). Another way for surface oxide removal may be energetic, preferably nitrogen or rare gas particle bombardment for example by charged $Ar^+$, $N_2^+$ or $N^+$ ions or neutral Ar or N atoms or $N_2$ molecules generated for example in a plasma source known in the art. Preferably ion or atom sputtering energies are kept low, for example close to the sputter threshold in order to minimize Si amorphization. Suitable ion and neutral particle energies may range between about 70-100 eV or preferably between about 50-70 eV or even more preferably between about 40-50 eV (see for example S. S. Todorov et al. in Appl. Phys. Lett. 52, 365 (1988), the entire disclosure of which is hereby incorporated by reference).

Covalent bonding, resulting in an electrically conducting bond, is preferably carried out below 400° C. or more preferably below 300° C. or even more preferably below 200° C. The most desirable bonding temperature is below 100° C. or even room temperature. The bonding may be followed by optional post-bonding annealing, preferably at low temperatures for example in the range between 100° C. and 200° C., or between 200° C. and 300° C., or at most between 300° C. and 400° C. In any case they must be below about 450° C. in order to avoid disintegration of the metallization of CMOS processed wafer 212.

Absorber wafer 257" is provided with metallized back contact 232 on epitaxial absorber layer 218". When a large voltage 230 is applied to metallized back contact 232 of the absorber wafer, resulting substantially in the depletion of absorber wafer 257" and drift region 228 of CMOS processed wafer 212, electron-hole pairs generated by absorbed high energy material particles or photons are separated in the associated electric field and travel along the electric field lines 26 rather than by diffusive transport. Depending on the sign of voltage 230, either electrons or holes are collected by charge collector implants 238, defining the size L of pixels 241, and metal electrode 232, respectively.

Referring now to FIG. 3D, the fourth embodiment 200''' combines features of the second and third embodiments. The fourth embodiment of monolithically integrated pixel detector 210''' comprises a CMOS processed wafer 212 with readout electronics 214 on the its front side 216 and a pixelated absorber wafer 257''', which comprises a pixelated absorber layer 218''' on a large Si substrate 256, said substrate bonded by low temperature wafer bonding onto the back side 220 of the CMOS wafer 212. Embodiment 200''' is the preferred embodiment for absorber layers 218''' which cannot be grown in the form of large single crystals suitable for wafer fabrication, but which can be grown as pixelated epitaxial absorber layers 218''' in the form of epitaxial absorber patches 252' of width $w_3$ separated by trenches 254' of width $w_4$ on a large Si substrate 256. Pixelated absorbers, including Si absorbers, have the additional benefit of improved spatial resolution because charge carriers cannot spread as much on their way to the charge collectors. Sidewalls 274' of absorber patches 252' are preferably passivated by first dielectric layer 236', optionally followed by further dielectric layers, to prevent surface leakage along sidewalls 274' when detector 210''' is in operation. The width $w_3$ of distinct absorber patches 252' may be larger, equal or smaller than the pixel size L defined by charge collector implants 238. Width $w_3$ may range between about 50-100 μm or preferably between 20-50 μm or even more preferably between 5-20 μm or even between 1-5 μm. The preferred value of width $w_3$ may be chosen in order for the misfit stress to be released by elastic relaxation of absorber patches 252' in order to keep them defect-free. The width $w_4$ of trenches 254' are preferably smaller that the width $w_3$ of absorber patches 252' and even more preferably much smaller. For absorber patches 252' defined by the spacing of dielectric mask openings in ART, they may be as narrow as the minimum width achievable by the lithography and deep reactive ion etching techniques, for example 1-5 μm or even about 0.1-1 μm. The width $w_4$ of trenches obtained by self-limited lateral growth of absorber patches 252' may be even smaller, for example 100 nm-1 μm, or even 20 nm-100 nm.

Embodiment 200''' is the most preferred embodiment for absorber layers which are both lattice and thermally mismatched with the Si substrate 256 but may be applicable also to lattice matched absorbers such as Si absorbers themselves. The most preferred material of epitaxial absorber layers 218''' may be a $Si_{1-x}Ge_x$ alloy which may preferably have a Ge content above 20% and which may preferably be compositionally graded for example from pure Si up to a final Ge content. In a preferred aspect of the embodiment the $Si_{1-x}Ge_x$ alloy may have a high Ge content x of about $0.6 \leq x \leq 0.8$. In an even more preferred aspect of the embodiment the $Si_{1-x}Ge_x$ alloy may be compositionally graded to a high Ge content x of about $0.6 \leq x \leq 0.8$ and optionally have a cap region of constant composition equal or nearly equal for example within 1-2% to the final composition of the graded part, which may for example be graded linearly. In a most preferred aspect of embodiment 200''' interface 258 between Si substrate 256 and pixelated epitaxial absorber layer 218''' is substantially defect-free, i.e. exhibits a dislocation density of about $10^5$-$10^6$ cm$^{-2}$ or even $10^4$-$10^5$ cm$^{-2}$ or even less. As known to one skilled in the art, this can be achieved for example by choosing width $w_3$ of semiconductor patches 252' forming pixelated epitaxial absorber layer 218''' and the grading rate both sufficiently small to permit elastic relaxation of the misfit stress during the epitaxial growth of absorber layer 218''' (see for example M. Salvalaglio, J. Appl. Phys. 116, 104306 (2014), the entire disclosure of which is hereby incorporated by reference). The grading rate may preferably be chosen between about 2-3%, or more preferably between about 1-2%, or even between 0.5-1%. In other aspects of the embodiment interface areas 258 between substrate 256 and patches 252' of pixelated absorber layer 218''' may not be substantially defect-free, but of sufficiently small size to keep dark currents at acceptable levels, when a large voltage 230 is applied to metallized back contact 232' of absorber layer 218''' and implants 238 of CMOS processed wafer 212. As known to one skilled in the art, such small interface regions are commonly employed for example in techniques of aspect ratio trapping (ART), wherein threading dislocations are trapped at the sidewalls of windows in a dielectric mask into which a semiconductor is selectively grown (see for example I. Åberg et al., IEDM San Francisco, 2010, the entire disclosure of which is hereby incorporated by reference). With the help of ART also other absorber materials may be used apart from SiGe, such as GaAs, CdTe or $Cd_{1-x}Zn_xTe$ alloys.

The width $w_4$ of trenches 254' is preferably smaller than the size $w_3$ of absorber patches 252' or even more preferably much smaller. The width $w_4$ of trenches may be below 1 μm or below 200 nm or even below 100 nm, when a self-limited epitaxial growth process and deeply patterned substrates are used to define the size $w_3$ of absorber patches 252' as known in the art (see for example International Patent Application No. WO 2011/135432 to von Känel, the entire disclosure of which is hereby incorporated by reference). Alternatively, when a method of ART is used to define the size $w_3$ of absorber patches 252', the width $w_4$ of trenches 254' may be defined by the spacing of dielectric windows, which may be as narrow as the minimum width achievable by the lithography and deep reactive ion etching techniques used for patterning the dielectric mask, such as for example 1-5 μm or even 0.1-1 μm.

Preferably backside surface 220 of CMOS processed wafer 212 and surface 219''' of substrate 256 are bonded by covalent bonds 250" providing an intimate electrical contact, preferably with few or no interface states and no oxide between absorber wafer 257''' and drift region 228 across the entire backside 220 of wafer 212.

Substrate 256 is preferably thinned before direct wafer bond with CMOS processed wafer 212 is formed. The preferable thickness of thinned substrate 256 is between about 10-100 μm, and more preferably between about 10-50 μm and even more preferably between about 10-20 μm. In another aspect of the embodiment the substrate may be removed completely. This may be achieved by bonding surface 253' of distinct absorber patches 252' of absorber wafer 257''' onto the backside surface of 220 of wafer 212. In this aspect of the embodiment electrically conducting direct wafer bond 250" may no longer be a Si—Si bond if surface 253' of distinct absorber patches 252' is not a silicon surface.

Preferably, CMOS wafer 212 is also thinned such that the thickness d of drift region 228 is in the range of 10-100 μm or more preferably about 10-50 μm or even more preferably about 10-20 μm. In order for an intimate electrical contact to be established backside surface 220 of wafer 212 and the bonding surface of substrate 256 have to be atomically flat and particle-free. It may be advisable to subject backside surface 220 of wafer 212 and the bonding surface of absorber wafer 257''' to a chemical-mechanical polishing step prior to the surface treatment required for covalent bonding. The bonding process preferably comprises steps of optional in situ pre-bonding annealing to reduce moisture before the in situ surface treatment providing oxide-free surfaces suitable for covalent bonding. Annealing temperatures may range between 100° C. and 200° C., or between 200° C. and 300° C. The surface treatment required for covalent bonding may include steps from a list of steps comprising ex situ wet chemical oxide removal and hydrogen passivation for example by a dilute HF dip or exposure to HF vapor, followed by in situ soft ion bombardment or laser exposure for removal of adsorbed H. The preferred method for removal of the hydrogen passivation may be by low energy H or He ions. He ions with energies between about 100-200 eV are known to remove H without any significant recoil implantation (see for example M. R. Tesauro et al. in Surf. Sci. 415, 37 (1998), the entire disclosure of which is hereby incorporated by reference) and much higher energies are required to induce Si amorphization (see for example V. F. Reutov et al, in Techn. Phys. Lett. 28, 615 (2002), the entire disclosure of which is hereby incorporated by reference). Another way for in situ surface oxide removal may be energetic, preferably nitrogen or rare gas particle bombardment for example by charged $Ar^+$, $N_2^+$ or $N^+$ ions or neutral Ar or N atoms or $N_2$ molecules generated for example in a plasma source known in the art. Preferably ion or atom sputtering energies are kept low, for example close to the sputter threshold in order to minimize Si amorphization. Suitable ion and neutral particle energies may range between about 70-100 eV or preferably between about 50-70 eV or even more preferably between about 40-50 eV (see for example S. S. Todorov et al. in Appl. Phys. Lett. 52, 365 (1988), the entire disclosure of which is hereby incorporated by reference).

Covalent bonding, resulting in an electrically conducting bond, is preferably carried out below 400° C. or more preferably below 300° C. or even more preferably below 200° C. The most desirable bonding temperature is below 100° C. or even room temperature. The bonding may be followed by optional post-bonding annealing. Annealing temperatures may range between 100° C. and 200° C., or between 200° C. and 300° C., or between 300° C. and 400° C. In any case they must be below about 450° C. in order to avoid disintegration of the metallization of CMOS processed wafer 212. Absorber wafer 257''' is provided with metallized back contact 232'. Distinct absorber patches 252' may therefore be electrically connected by metallized back contact 232' extending substantially across the whole surface of the absorber.

When a large voltage 230 is applied to metallized back contact 232' of absorber wafer 257''', resulting substantially in the depletion of absorber 257''' and drift region 228 of CMOS processed wafer 212, electron-hole pairs generated by absorbed high energy material particles or photons are separated in the associated electric field and travel along the electric field lines 26 rather than by diffusive transport. Depending on the sign of voltage 230, either electrons or holes are collected by charge collector implants 238, defining the size L of pixel 241, and metal electrode 232', respectively.

Figure 4:
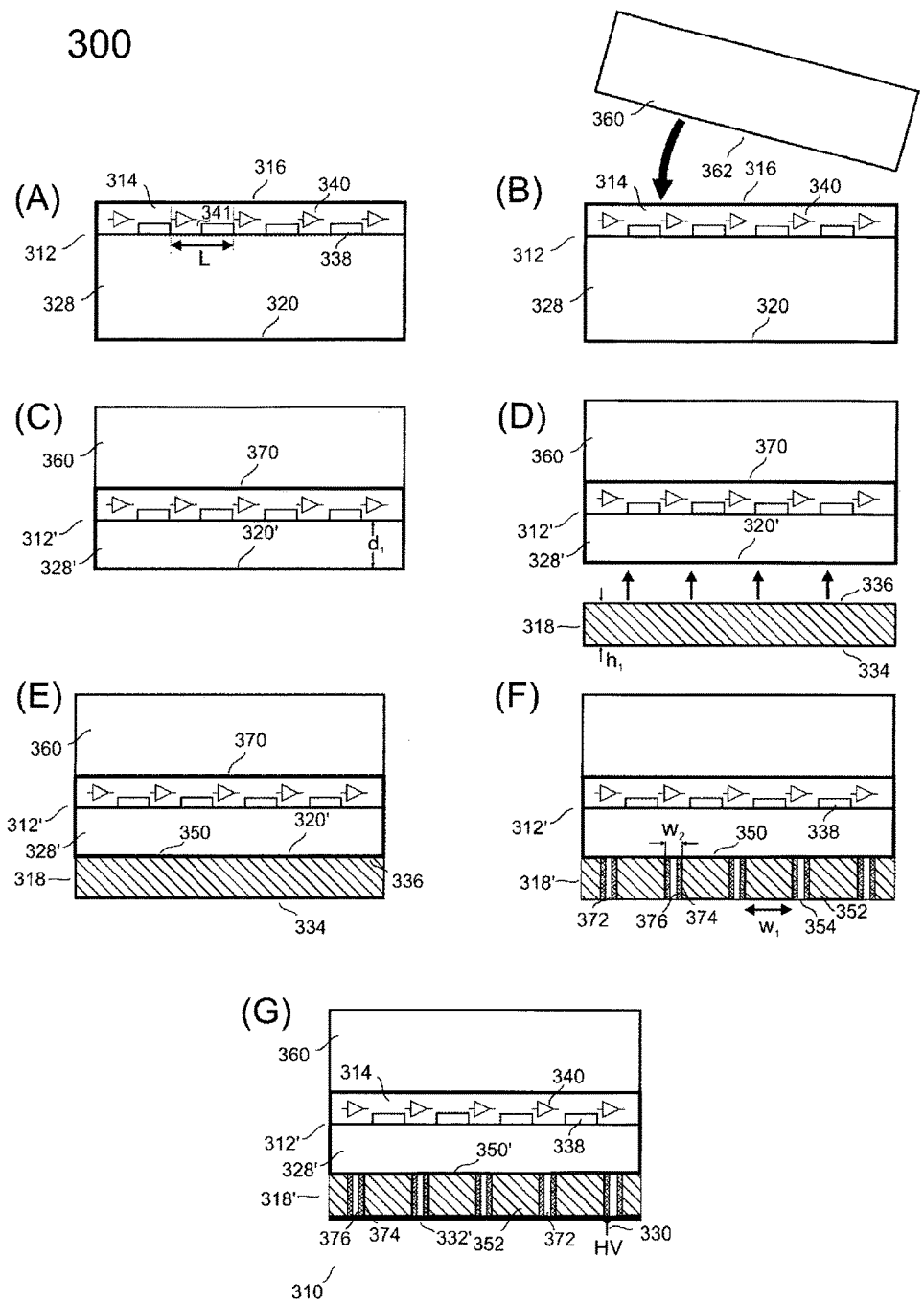
FIG. 4A is a cross-section of a CMOS processed wafer with a readout electronics.
FIG. 4B is a cross-section of a CMOS processed wafer with a readout electronics and a handling wafer.
FIG. 4C is a cross-section of a thinned CMOS processed wafer bonded to a handling wafer.
FIG. 4D is a cross-section of a thinned CMOS processed wafer with a readout electronics and an absorber layer.
FIG. 4E is a cross-section of a thinned CMOS processed wafer with a readout electronics and a handling wafer bonded to the front, and an absorber layer bonded to the back.
FIG. 4F is a cross-section of a thinned CMOS processed wafer with a readout electronics, a handling wafer bonded to the front, and a pixelated and passivated absorber layer bonded to the back.
FIG. 4G is a cross-section of a thinned CMOS processed wafer with a readout electronics, a handling wafer bonded to the front, and a pixelated, passivated and contacted absorber layer bonded to the back.

Referring now to FIG. 4A-G, fabrication 300 of monolithic pixel detector 310 may include the following steps. In a first step (FIG. 4A) Si wafer 312 which may be lightly p-doped with a resistivity preferably above 100 Ωcm or more preferably above 500 Ωcm or even more preferably above 1000 Ωcm is CMOS processed to obtain readout electronics 314 the part 340 of which may be contained in every pixel 341 of size L, defined by the spacing of charge collector implants 338. In a second step (FIG. 4B) handling wafer 360 may be bonded onto the optionally chemically-mechanically polished surface 316 of wafer 312. The bond 370 between surface 316 of CMOS wafer 312 and surface 362 of handling wafer 360 may not be a permanent bond, but must be strong enough to permit thinning of CMOS wafer 312 to produce thinned CMOS wafer 312' in a third step (FIG. 4C). The thinning may be realized for example by grinding and subsequent chemical-mechanical polishing of backside surface 320 of wafer 312 to reduce the thickness $d_1$ of lightly doped drift region 328' to below 200 µm. In a preferred aspect of the embodiment the thickness $d_1$ may be about 10-100 µm, in a more preferred aspect about 10-50 µm, and in an even more preferred aspect it may be as low as for example 10-20 µm. In a fourth step (FIG. 4D) thinned CMOS wafer 312 with backside surface 320' is bonded onto upper surface 336 of absorber wafer 318 (having lower surface 334) of thickness $h_1$. Absorber wafer 318 may also have undergone chemical-mechanical polishing prior to the surface treatment required for covalent bonding. The bonding process preferably comprises steps of optional in situ pre-bonding annealing to reduce moisture from wafers 312', 318 before the in situ surface treatment providing oxide-free surfaces suitable for covalent bonding. Annealing temperatures may range between 100° C. and 200° C., or between 200° C. and 300° C. The surface treatment required for covalent bonding may include steps from a list of steps comprising ex situ wet chemical oxide removal and hydrogen passivation for example by a dilute HF dip or exposure to HF vapor, followed by in situ soft ion bombardment or laser exposure for removal of adsorbed H. The preferred method for removal of the hydrogen passivation may be by low energy H or He ions. He ions with energies between about 100-200 eV are known to remove H without any significant recoil implantation (see for example M. R. Tesauro et al. in Surf. Sci. 415, 37 (1998), the entire disclosure of which is hereby incorporated by reference) and much higher energies are required to induce Si amorphization (see for example V. F. Reutov et al, in Techn. Phys. Lett. 28, 615 (2002), the entire disclosure of which is hereby incorporated by reference). Another way for in situ surface oxide removal may be energetic, preferably nitrogen or rare gas particle bombardment for example by charged $Ar^+$, $N_2^+$ or $N^+$ ions or neutral Ar or N atoms or $N_2$ molecules generated for example in a plasma source known in the art. Preferably ion or atom sputtering energies are kept low, for example close to the sputter threshold in order to minimize Si amorphization. Suitable ion and neutral particle energies may range between about 70-100 eV or preferably between about 50-70 eV or even more preferably between about 40-50 eV (see for example S. S. Todorov et al. in Appl. Phys. Lett. 52, 365 (1988), the entire disclosure of which is hereby incorporated by reference).

Covalent bonding, resulting in an electrically conducting bond, is preferably carried out below 400° C. or more preferably below 300° C. or even more preferably below 200° C. The most desirable bonding temperature is below 100° C. or even room temperature. The bonding may be followed by an optional post-bonding anneal at low temperature in a fifth step (FIG. 4E), preferably in the range between about 100° C. and 200° C., or between 200° C. and 300° C., or between 300° C. and 400° C., providing strong and electrically conductive bond 350 between backside surface 320' of CMOS processed and thinned wafer 312' and surface 336 of absorber wafer 318. If the absorber material is characterized by a large mismatch of the thermal expansion coefficients with respect to those of Si wafer 312', such as GaAs, CdTe, $Cd_{1-x}Zn_xTe$ alloys and Ge as well as Ge-rich $Si_{1-x}Ge_x$ alloys, for all of which it is above 120%, absorber wafer 318' may be optionally patterned in the form of distinct patches 352 of width $w_1$ separated by trenches 354 of width $w_2$ in a sixth step (FIG. 4F) before the optional post-bonding anneal in order to avoid any undesirable thermal stress. The optional patterning reduces the direct wafer bond to bonds 350' between distinct patches of absorber wafer 318' and thinned wafer 312'. The width $w_1$ of distinct absorber patches 352 may be larger, equal or smaller than the pixel size L defined by charge collector implants 338. Width $w_1$ may hence range between about 200-500 µm or between about 100-200 µm or between 50-100 µm. The width is preferably chosen in accordance with the size of the thermal mismatch in order to avoid the formation of thermal cracks during the bonding process or during an optional post-bonding anneal. The patterning may be omitted if both covalent bonding and post-bonding anneal are carried out at sufficiently low temperatures to avoid any significant thermal stress. The width $w_2$ of trenches 354 is preferably smaller than the size $w_1$ of absorber patches 352 or even more preferably much smaller. The width $w_2$ of trenches 354 may be as narrow as the minimum width achievable by the lithography and deep reactive ion etching techniques known in the art (see for example X. Li et al., in Sensors and Actuators A87, 139 (2001) and E. H. Klaassen, in Sensors and Actuators A52, 132 (1996), the entire disclosure of which are hereby incorporated by reference). It may be advisable to coat sidewalls 374 of distinct absorber patches 352 with a dielectric film 376 providing a surface passivation and thereby reducing leakage currents during the operation of the pixel sensor. In a seventh step (FIG. 4G) trenches 354 may be optionally filled with insulating material 372, and metallic contact 332' may be formed preferably as a continuous metallization layer connecting distinct absorber patches 352 in parallel. If patterning of absorber wafer 318 is omitted metallic contact 332' may instead be formed on absorber surface 334 directly under the omission of the sixth step (FIG. 4F).

When a large voltage 330 is applied to metallized back contact 332' of absorber wafer 318', resulting substantially in the depletion of absorber wafer 318' and thinned drift region 328' of thinned CMOS processed wafer 312', electron-hole pairs generated by absorbed high energy material particles or photons are separated in the associated electric field and travel along the electric field lines 26 rather than by diffusive transport. Depending on the sign of voltage 330, electrons or holes are collected by charge collector implants 338 of pixel detector 310.

Referring now to FIG. 5A-K, fabrication 400 of monolithic pixel detector 410, may include the following steps, not necessarily executed in the order shown. In a first step (FIG. 5A) Si wafer 412 with front side surface 416 and backside surface 420, which may for example be lightly p-doped with a resistivity preferably above 100 Ωcm or more preferably above 500 Ωcm or even more preferably above 1000 Ωcm, is CMOS processed to obtain readout electronics 414 part 440 of which may be contained in every pixel 441 of size L, defined by the spacing of charge collector implants 438. In a second step (FIG. 5B) surface 488 of Si substrate wafer 456 may be patterned and cleaned in order for wafer 456 to serve as a substrate for epitaxial absorber layer 418 to be grown onto surface 488 in the form of distinct absorber patches 452 of width $w_3$ and height $h_2$ separated by trenches 454 of width $w_4$. Si wafer 456 and pixelated epitaxial absorber layer 418 together comprise absorber wafer 457 with absorber layer surface 434. The width $w_3$ of distinct absorber patches 452 may be larger, equal or smaller than the pixel size L defined by charge collector implants 438. Width $w_3$ may range between about 50-100 µm or preferably between 20-50 µm or even more preferably between 5-20 µm or even between 1-5 µm. The preferred value of width $w_3$ may be chosen in order for the misfit stress to be released by elastic relaxation of absorber patches 452 in order to keep them defect-free. The width $w_4$ of trenches may be below 1 µm or below 200 nm or even below 100 nm, when a self-limited epitaxial growth process and deeply patterned substrates are used to define the size $w_3$ of absorber patches 452 as known in the art (see for example International Patent Application No. WO 2011/135432 to von Känel, the entire disclosure of which is hereby incorporated by reference). Alternatively, when a method of ART is used to define the size $w_3$ of absorber patches 452, the width of trenches $w_4$ may be defined by the spacing of dielectric windows, which may be as narrow as the minimum width achievable by the lithography and deep reactive ion etching techniques known in the art, for example 1-5 µm or even 0.1-1 µm (see for example X. Li et al., in Sensors and Actuators A87, 139 (2001) and E. H. Klaassen, in Sensors and Actuators A52, 132 (1996), the entire disclosure of which are hereby incorporated by reference). After the epitaxial growth sidewalls 474 of distinct absorber patches 452 may optionally be passivated by a dielectric passivation layer. The passivation layer may comprise for example first dielectric layer 436 designed to control surface leakage along sidewalls 474 when pixel detector 410 is in operation. First dielectric layer may be a thermal oxide or an oxide formed by atomic layer deposition (ALD). The passivation layer may optionally comprise second dielectric layer 476, which may provide additional protection of sidewalls 474 against environmental influences. It may for example be made of $Al_2O_3$ which may be deposited by atomic layer deposition as known in the art. Trenches 454 may additionally be filled by dielectric filling material 472 to provide stability in an optional step of chemical-mechanical polishing as a preparation of absorber layer surface 434 of absorber wafer 457 for the subsequent low temperature wafer bonding to handling wafer 480.

In third step (FIG. 5C) surface 416 of Si wafer 412 may undergo an optional chemical mechanical polishing step before being bonded to surface 462 of handling wafer 460 as a means to provide mechanical stability in the subsequent thinning of Si wafer 412 and corresponding thinning of drift region 428. The thinning may be realized for example by grinding and subsequent chemical-mechanical polishing of backside surface 420 of Si wafer 412. In a fourth similar step (FIG. 5D) surface 434 of epitaxial absorber layer 418 may be bonded to surface 482 of handling wafer 480 as a means to provide mechanical stability in the subsequent thinning of substrate 456 for example in a chemical-mechanical polishing step. In the fifth step (FIG. 5E) drift region 428 of CMOS processed wafer 412 is thinned for example by plasma etching or by grinding wafer 412 followed by a chemical-mechanical polishing step to give rise of thinned CMOS wafer 412'. Thinned wafer 412' with thinned drift region 428' has a thickness $d_1$ which is preferably between about 10-100 µm, and more preferably between about 10-50 µm and even more preferably between about 10-20 µm. In a sixth step (FIG. 5F) absorber wafer 457 is made thinner, to give rise of thinned absorber wafer 457', by thinning from the side of surface 490 of substrate wafer 456 for example by plasma etching or by grinding followed by a chemical-mechanical polishing step. Thinned substrate 456' has a thickness $d_2$ which is preferably between about 10-100 µm, and more preferably between about 10-50 µm and even more preferably between about 10-20 µm. Covalent bonding of backside surface 420' of thinned wafer 412' onto surface 490' of thinned substrate 456', comprising the bonding surface of absorber wafer 457', preferably comprises steps of optional in situ pre-bonding annealing to reduce moisture from wafers 412', 456' before the in situ surface treatment providing oxide-free surfaces suitable for covalent bonding. Annealing temperatures may range between 100° C. and 200° C., or between 200° C. and 300° C. The surface treatment required for covalent bonding may include steps from a list of steps comprising ex situ wet chemical oxide removal and hydrogen passivation for example by a dilute HF dip or exposure to HF vapor, followed by in situ soft ion bombardment or laser exposure for removal of adsorbed H. The preferred method for removal of the hydrogen passivation may be by low energy H or He ions. He ions with energies between about 100-200 eV are known to remove H without any significant recoil implantation (see for example M. R. Tesauro et al. in Surf. Sci. 415, 37 (1998), the entire disclosure of which is hereby incorporated by reference) and much higher energies are required to induce Si amorphization (see for example V. F. Reutov et al, in Techn. Phys. Lett. 28, 615 (2002), the entire disclosure of which is hereby incorporated by reference). Another way for surface oxide removal may be energetic, preferably nitrogen or rare gas particle bombardment for example by charged $Ar^+$, $N_2^+$ or $N^+$ ions or neutral Ar or N atoms or $N_2$ molecules generated for example in a plasma source known in the art. Preferably ion or atom sputtering energies are kept low, for example close to the sputter threshold in order to minimize Si amorphization. Suitable ion and neutral particle energies may range between about 70-100 eV or preferably between about 50-70 eV or even more preferably between about 40-50 eV (see for example S. S. Todorov et al. in Appl. Phys. Lett. 52, 365 (1988), the entire disclosure of which is hereby incorporated by reference).

Figure 5:
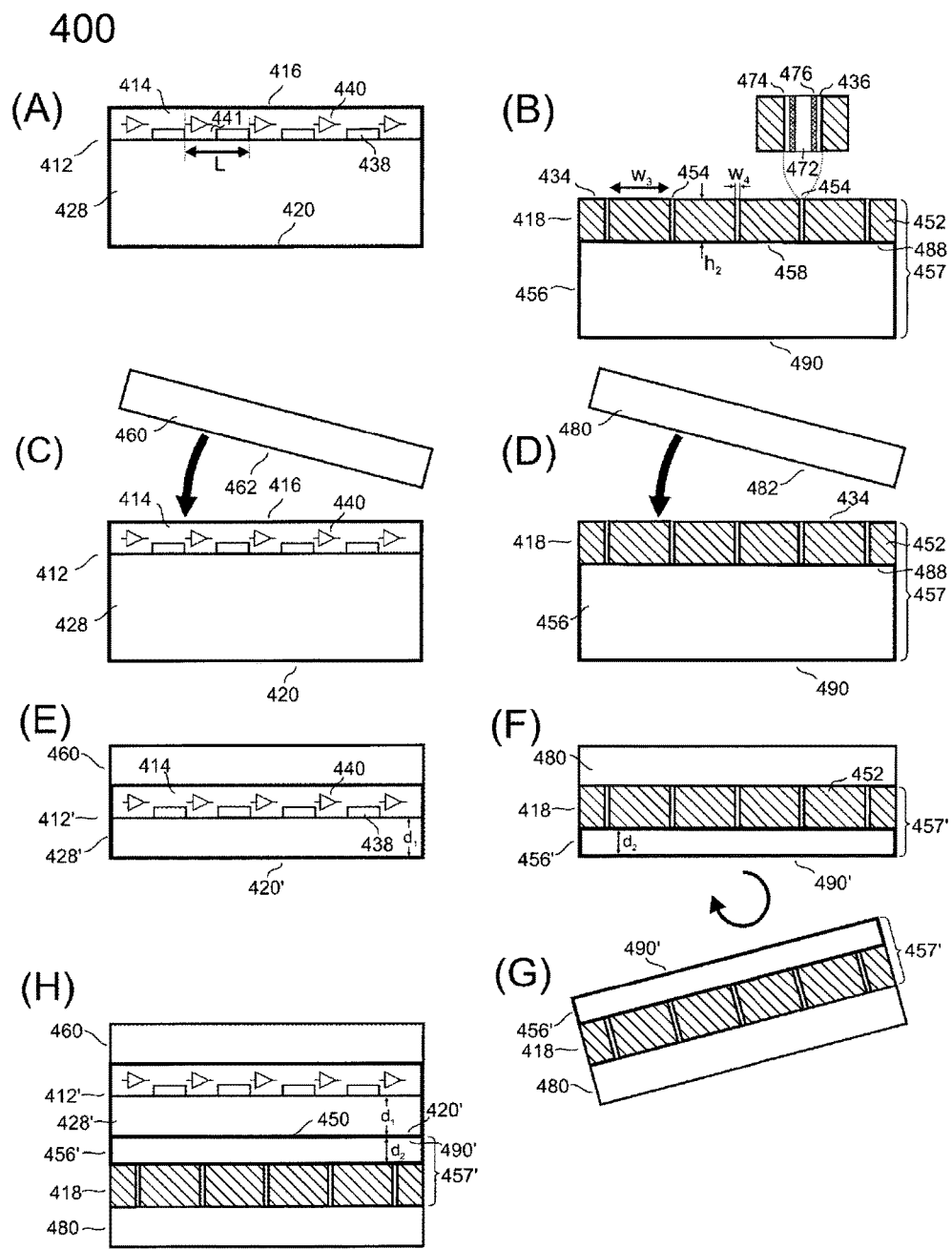
FIG. 5A is a cross-section of a CMOS processed wafer with a readout electronics.
FIG. 5B is a cross-section of a wafer with a pixelated and passivated epitaxial absorber layer.
FIG. 5C is a cross-section of a CMOS processed wafer with a readout electronics and a handling wafer.
FIG. 5D is a cross-section of a wafer with a pixelated and passivated epitaxial absorber layer and a handling wafer.
FIG. 5E is a cross-section of a thinned CMOS processed wafer bonded to a handling wafer.
FIG. 5F is a cross-section of a thinned substrate with a pixelated epitaxial absorber layer bonded to a handling wafer.
FIG. 5G is a cross-section of a flipped over thinned substrate with a pixelated epitaxial absorber layer bonded to a handling wafer.
FIG. 5H is a cross-section of a thinned CMOS processed wafer bonded to a thinned substrate with a pixelated epitaxial absorber layer.
FIG. 5I is a cross-section of a thinned CMOS processed wafer bonded to a thinned wafer with a pixelated epitaxial absorber layer after removal of the handling wafer.
FIG. 5J is a cross-section of a thinned CMOS processed wafer bonded to a thinned wafer with a pixelated epitaxial absorber layer after removal of handling wafer and bonding residues.
FIG. 5K is a cross-section of a thinned CMOS processed wafer bonded to a thinned wafer with a pixelated, electrically contacted epitaxial absorber layer.
Figure 5:
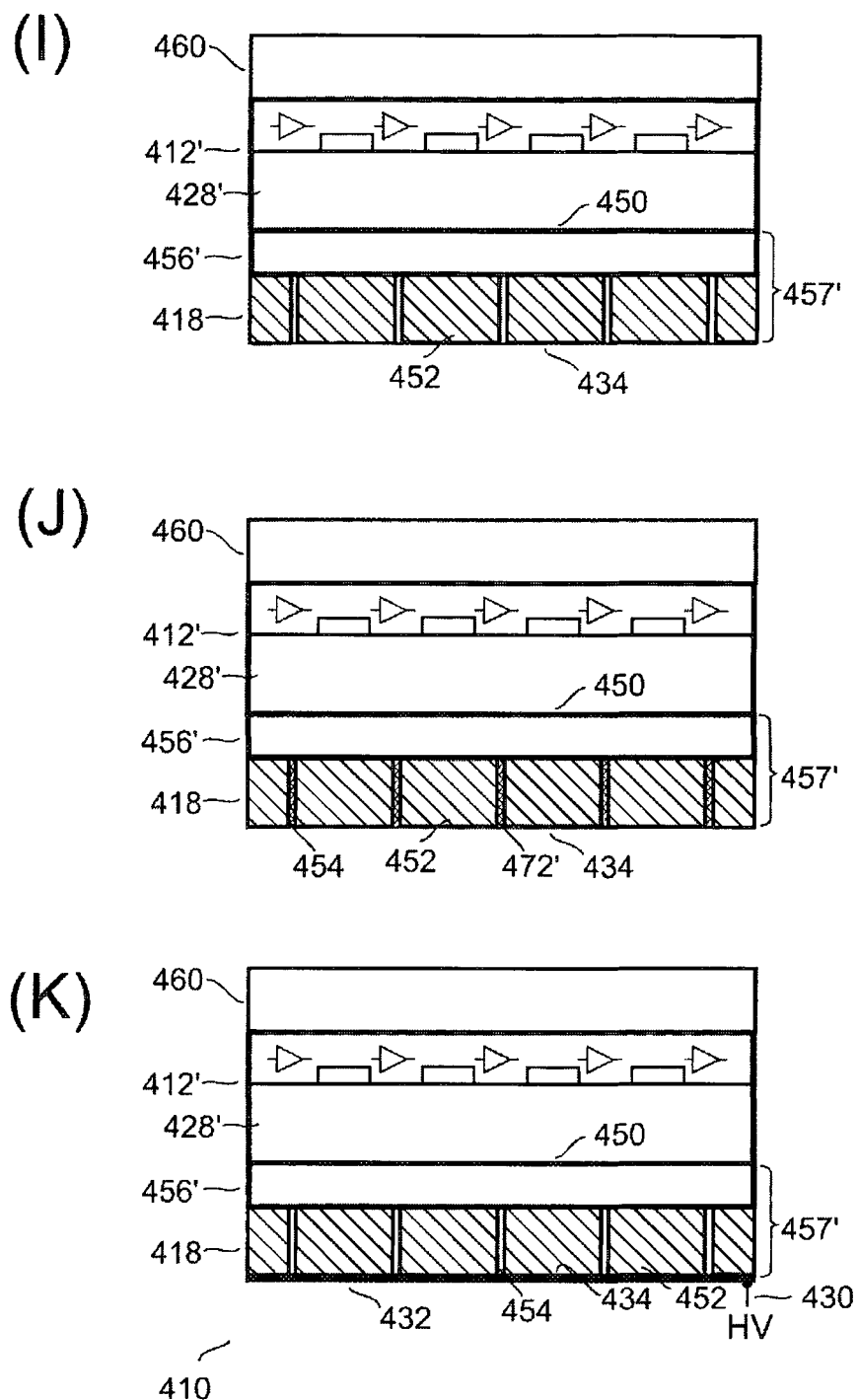

In a seventh step (FIG. 5G) thinned substrate 456' or thinned. CMOS wafer 412' is flipped upside down, such that surfaces 420' and 490' prepared for covalent wafer bonding face each other to be joined in electrically conducting covalent bond 450 between thinned wafer 412' and surface 490' of thinned absorber wafer 457' in an eighth step (FIG. 5H). Covalent bonding is preferably carried out below 400° C. or more preferably below 300° C. or even more preferably below 200° C. The most desirable bonding temperature is below 100° C. or even room temperature. The bonding may be followed by optional post-bonding annealing at low temperature. Annealing temperatures may range between 100° C. and 200° C., or between 200° C. and 300° C., or between 300° C. and 400° C. In any case they must be below about 450° C. in order to avoid disintegration of the metallization of CMOS processed wafer 412'. After the optional post-bonding anneal handling wafer 480 is removed in a ninth step (FIG. 5I), whereby surface 434 of epitaxial absorber layer 418 is again exposed. In a tenth step (FIG. 5J) surface 434 of epitaxial absorber layer 418 may be subjected to an optional cleaning step to remove the bonding residues of handling wafer 480. Subsequently, trenches 454 between absorber patches 452 may be optionally be filled by filling material 472' unless said trenches have already been filled by filling material 472 in the second step (FIG. 5B). In an eleventh step (FIG. 5K) complete pixel detector 410 is finally obtained by metallizing surfaces 434 of absorber patches 452 with metal layer 432, preferably acting as a continuous metallic contact to which high voltage lead 430 may be attached to deplete drift regions 428' of thinned CMOS processed wafer 412' and thinned substrate 456' as well as epitaxial absorber layer 418.

Fabrication 400 may be the most preferred fabrication method of pixel detector 410 for epitaxial absorber layers 418 which are both lattice and thermally mismatched with the Si substrate 456. The preferred material of epitaxial absorber layers 418 may be a $Si_{1-x}Ge_x$ alloy which may preferably have a Ge content above 20% and which may preferably be compositionally graded for example from pure Si up to a final Ge content. A $Si_{1-x}Ge_x$ alloy with a high Ge content x of about $0.6 \le x \le 0.8$ may be an especially suitable alloy for epitaxial absorber layer 418. The most preferred $Si_{1-x}Ge_x$ alloy may be compositionally graded to a high Ge content x of about $0.6 \le x \le 0.8$ and optionally have a cap region of constant composition equal or nearly equal within for example 1-2% to the final composition of the graded part, which may for example be graded linearly. In the most preferred fabrication 400 of pixel detector 410 interface 458 between Si substrate 456 and pixelated epitaxial absorber layer 418 is substantially defect-free, i.e. exhibits a dislocation density of about $10^5$-$10^6$ $cm^{-2}$ or even $10^4$-$10^5$ $cm^{-2}$ or even less. This may for example be achieved by choosing width $w_3$ of absorber patches 452 forming pixelated epitaxial absorber layer 418 and the grading rate both sufficiently small to permit elastic relaxation of the misfit stress during the epitaxial growth of absorber layer 418 as proven to be effective in the simpler example of step graded SiGe nanostructures (see for example M. Salvalaglio et al., in J. Appl. Phys. 116, 104306 (2014), the entire disclosure of which is hereby incorporated by reference). The grading rate may preferably be chosen between about 2-3%, or more preferably between about 1-2%, or even between 0.5-1%. In other aspects of the embodiment interface areas 458 between substrate 456 and absorber patches 452 of pixelated epitaxial absorber layer 418 may not be substantially defect-free, but of sufficiently small size to keep dark currents at acceptable levels, when a large voltage 430 is applied to metallized back contact 432 of epitaxial absorber layer 418 and charge collector implants 438 of thinned CMOS processed wafer 412'. As known to one skilled in the art, such small interface regions are commonly employed for example in techniques of aspect ratio trapping (ART), wherein threading dislocations are trapped at the sidewalls of windows in a dielectric mask into which a semiconductor is selectively grown (see for example I. Åberg et al., in IEDM 2014, the entire disclosure of which is hereby incorporated by reference). With the help of ART also other absorber materials may be used apart from SiGe, such as GaAs, CdTe or CdZnTe.

In another aspect of the embodiment, suitable especially for particle detection, absorber layer 418 may be a Si wafer which is not patterned. This may allow the fabrication to be simplified, essentially by combining steps (C) to (F) before bonding step (H).

Referring now to FIG. 6A-H, alternative fabrication 500 of monolithic pixel detector 510, may include the following steps, not necessarily executed in the order shown. In a first step (FIG. 6A) Si wafer 512 with front side surface 516 and backside surface 520, which may for example be lightly p-doped with a resistivity preferably above 100 Ωcm or more preferably above 500 Ωcm or even more preferably above 1000 Ωcm, is CMOS processed to obtain readout electronics 514 part 540 of which may be contained in every pixel 541 of size L, defined by the spacing of charge collector implants 538. Absorber wafer 557 may be obtained in a second step (FIG. 6B), wherein surface 588 of Si wafer 556 is patterned and cleaned in order for wafer 556 to serve as a substrate for epitaxial absorber layer 518 to be grown onto surface 588 in the form of distinct absorber patches 552 forming interface 558 with Si substrate 556. Absorber patches 552 have width $w_3$ and height $h_2$ and are separated by trenches 554 of width $w_4$. The width $w_3$ of distinct absorber patches 552 may be larger, equal or smaller than the pixel size L defined by charge collector implants 538. Width $w_3$ may range between about 50-100 µm or preferably between 20-50 µm or even more preferably between 5-20 µm or even between 1-5 µm. The preferred value of width $w_3$ may be chosen in order for the misfit stress to be released by elastic relaxation of absorber patches 552 in order to keep them defect-free. The height of absorber patches 552 may be about 20-50 µm or preferably about 50-100 µm or even more preferably about 100-200 µm. The width $w_4$ of trenches may be below 1 µm or below 200 nm or even below 100 nm, when a self-limited epitaxial growth process and deeply patterned substrates are used to define the size $w_3$ of absorber patches 552 as known in the art, for example 1-5 µm or even 0.1-1 µm (see for example International Patent Application No. WO 2011/135432 to von Känel, the entire disclosure of which is hereby incorporated by reference). Alternatively, when a method of ART is used to define the size $w_3$ of absorber patches 552, the width of trenches $w_4$ may be defined by the spacing of dielectric windows, which may be as narrow as the minimum width achievable by the lithography and deep reactive ion etching techniques known in the art (see for example X. Li et al., in Sensors and Actuators A87, 139 (2001) and E. H. Klaassen, in Sensors and Actuators A52, 132 (1996), the entire disclosure of which are hereby incorporated by reference). After the epitaxial growth sidewalls 574 of distinct patches 552 may optionally be passivated by at least one dielectric passivation layer. The at least one passivation layer may comprise for example first dielectric layer 536 designed to control surface leakage along sidewalls 574 of absorber patches 552 when pixel detector 510 is in operation. First dielectric layer may be a thermal oxide or an oxide formed by atomic layer deposition (ALD). The passivation layer may optionally comprise second dielectric layer 576, which may provide additional protection of sidewalls 574 against environmental influences. It may for example be made of $Al_2O_3$ which may be deposited by atomic layer deposition as known in the art. Trenches 554 may additionally be filled by dielectric filling material 572 to provide stability in an optional step of grinding and chemical-mechanical polishing as a preparation of surface 534 of epitaxial absorber layer 518 for a subsequent wafer bonding step.

In third step (FIG. 6C) surface 516 of Si wafer 512 may undergo an optional chemical mechanical polishing step before being bonded to surface 562 of handling wafer 560 as a means to provide mechanical stability for the thinning of Si wafer 512.

In a fourth step (FIG. 6D) surface 534 of epitaxial absorber layer 518 may subjected to a chemical-mechanical polishing step whereby the height of epitaxial absorber layer may be slightly reduced for example by 1-4 μm to the height $h_3$.

In a fifth step (FIG. 6E) CMOS processed wafer 512 and correspondingly drift region 528 may be thinned to give rise to thinned CMOS processed wafer 512'. The thinning may be realized for example by plasma etching or by grinding backside surface 520 of wafer 512 and by a following chemical-mechanical polishing step. Thinned wafer 512' with drift region 528' thereby assumes a thickness $d_1$ which is preferably between about 10-100 μm, and more preferably between about 10-50 μm, and even more preferably between about 10-20 μm. The fabrication of monolithic pixel detector 510 further comprising covalent bonding of thinned wafer 512' and absorber wafer 557 preferably comprises the following additional steps. Covalent bonding of backside surface 520' of thinned wafer 512' onto surface 534 of epitaxial absorber layer 518, resulting in an electrically conducting bond 550, in a sixth step (FIG. 6F) preferably comprises steps of optional in situ pre-bonding annealing to reduce moisture from wafers 512', 557 before the surface treatment providing oxide-free surfaces suitable for covalent bonding. Annealing temperatures may range between 100° C. and 200° C., or between 200° C. and 300° C. The surface treatment required for covalent bonding may include steps from a list of steps comprising ex situ wet chemical oxide removal and hydrogen passivation for example by a dilute HF dip or exposure to a HF vapor, followed by in situ soft ion bombardment or laser exposure for removal of adsorbed H. The preferred method for removal of the hydrogen passivation may be by low energy H or He ions. He ions with energies between about 100-200 eV are known to remove H without any significant recoil implantation (see for example M. R. Tesauro et al. in Surf. Sci. 415, 37 (1998), the entire disclosure of which is hereby incorporated by reference) and much higher energies are required to induce Si amorphization (see for example V. F. Reutov et al, in Techn. Phys. Lett. 28, 615 (2002), the entire disclosure of which is hereby incorporated by reference). Another way for surface oxide removal may be energetic, preferably nitrogen or rare gas particle bombardment for example by charged $Ar^+$, $N_2^+$ or $N^+$ ions or neutral Ar or N atoms or $N_2$ molecules generated for example in a plasma source known in the art. Preferably ion or atom sputtering energies are kept low, for example close to the sputter threshold in order to minimize Si amorphization. Suitable ion and neutral particle energies may range between about 70-100 eV or preferably between about 50-70 eV or even more preferably between about 40-50 eV (see for example S. S. Todorov et al. in Appl. Phys. Lett. 52, 365 (1988), the entire disclosure of which is hereby incorporated by reference).

Figure 6:
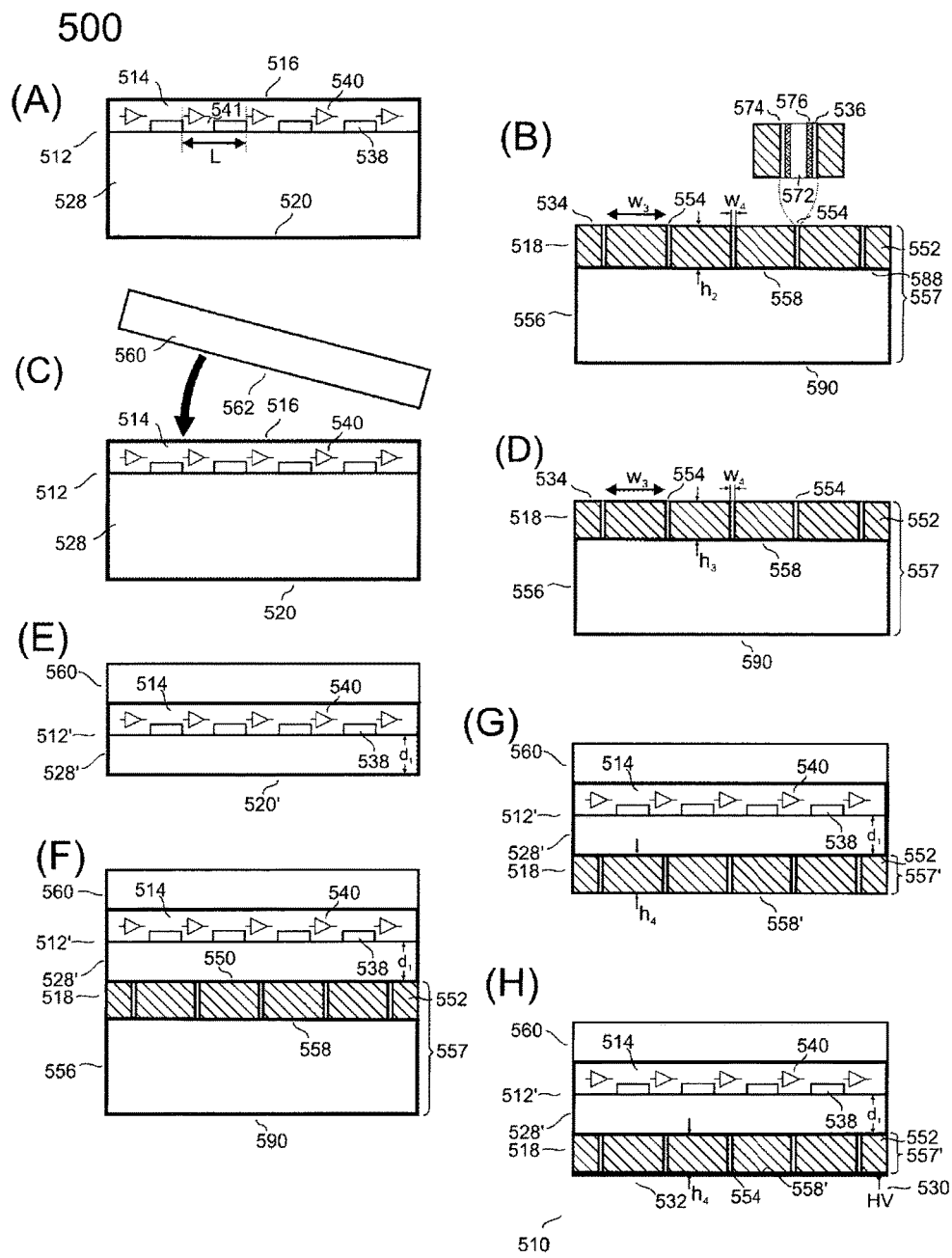
FIG. 6A is a cross-section of a CMOS processed wafer with a readout electronics.
FIG. 6B is a cross-section of a wafer with a pixelated and passivated epitaxial absorber layer.
FIG. 6C is a cross-section of a CMOS processed wafer with a readout electronics and a handling wafer.
FIG. 6D is a cross-section of a wafer with a pixelated and passivated epitaxial absorber layer after chemical mechanical polishing.
FIG. 6E is a cross-section of a thinned CMOS processed wafer bonded to a handling wafer.
FIG. 6F is a cross-section of a thinned CMOS processed wafer bonded to a pixelated epitaxial absorber layer.
FIG. 6G is a cross-section of a thinned CMOS processed wafer bonded to a pixelated epitaxial absorber layer after substrate removal.
FIG. 6H is a cross-section of a thinned CMOS processed wafer with a readout electronics bonded to a pixelated epitaxial absorber layer after substrate removal and electrical contact formation.

Covalent bonding (FIG. 6F) is preferably carried out below 400° C. or more preferably below 300° C. or even more preferably below 200° C. The most desirable bonding temperature is below 100° C. or even room temperature. The bonding may be followed by optional post-bonding anneal. Annealing temperatures may range between 100° C. and 200° C., or between 200° C. and 300° C., or between 300° C. and 400° C. In any case they must be below about 450° C. in order to avoid disintegration of the metallization of CMOS processed wafer 512'. After the optional post-bonding anneal substrate 556 of epitaxial absorber layer 518 may be removed in a seventh step, either by grinding and chemical mechanical polishing of surface 590 or by a plasma etching step to expose surfaces 558' of thinned absorber wafer 557' with absorber patches 552 (FIG. 6G). It may be advantageous to etch away also part of absorber patches 552 during this etching step to reduce their height to ha, especially if their interface with substrate 512, 512' is not defect-free. Height ha may be smaller by a few μm than height $h_3$, so that in addition to misfit dislocations also threading dislocations are removed in this etching step. In an eighth step (FIG. 6H) complete pixel detector 510 is finally obtained by metallizing surfaces 558' of thinned absorber wafer 557', preferably by electrically connecting absorber patches 552 with metal layer 532 acting as a metallic contact to which high voltage lead 530 may be attached to deplete drift regions 528' and epitaxial absorber layer 518.

Fabrication 500 of pixel detector 510 has the advantage that only the thickness $d_1$ of thinned drift region 528' along with the height ha of absorber patches 552 need to be depleted during detector operation. It may also be a preferred fabrication method of pixel detector 510 for epitaxial absorber layers 518 which are both lattice and thermally mismatched with the Si substrate 556. The preferred material of epitaxial absorber layers 518 may be a $Si_{1-x}Ge_x$ alloy which may preferably have a Ge content above 20% and which may preferably be compositionally graded for example from pure Si up to a final Ge content. A $Si_{1-x}Ge_x$ alloy with a high Ge content x of about $0.6 \leq x \leq 0.8$ may be an especially suitable alloy for epitaxial absorber layer 518. The most preferred $Si_{1-x}Ge_x$ alloy may be compositionally graded to a high Ge content x of about $0.6 \leq x \leq 0.8$ and optionally have a cap region of constant composition equal or nearly equal within for example 1-2% to the final composition of the graded part, which may for example be graded linearly. In the most preferred fabrication 500 of pixel detector 510 interface 558 between Si substrate 556 and pixelated epitaxial absorber layer 518 is substantially defect-free, i.e. exhibits a dislocation density of about $10^5$-$10^6$ $cm^{-2}$ or even $10^4$-$10^5$ $cm^{-2}$ or even less. This may for example be achieved by choosing width $w_3$ of absorber patches 552 forming pixelated epitaxial absorber layer 518 and the grading rate both sufficiently small to permit elastic relaxation of the misfit stress during the epitaxial growth of absorber layer 518 as proven to be effective in the simpler example step graded SiGe nanostructures of (see for example M. Salvalaglio et al., in J. Appl. Phys. 116, 104306 (2014), the entire disclosure of which is hereby incorporated by reference). The grading rate may preferably be chosen between about 2-3%, or more preferably between about 1-2%, or even between 0.5-1%. In other aspects of the embodiment interface areas 558 between substrate 556 and absorber patches 552 of pixelated epitaxial absorber layer 518 may not be substantially defect-free, but of sufficiently small size to keep dark currents at acceptable levels, when a large voltage 530 is applied to metallized back contact 532 of epitaxial absorber layer 518 and charge collector implants 538 of thinned CMOS processed wafer 512'. As known to one skilled in the art, such small interface regions are commonly employed for example in techniques of aspect ratio trapping (ART), wherein threading dislocations are trapped at the sidewalls of windows in a dielectric mask into which a semiconductor is selectively grown (see for example I. Åberg et al., in IEDM San Francisco, 2010, the entire disclosure of which is hereby incorporated by reference). With the help of ART also other absorber materials may be used apart from SiGe, such as GaAs, CdTe or CdZnTe.

Figure 7:
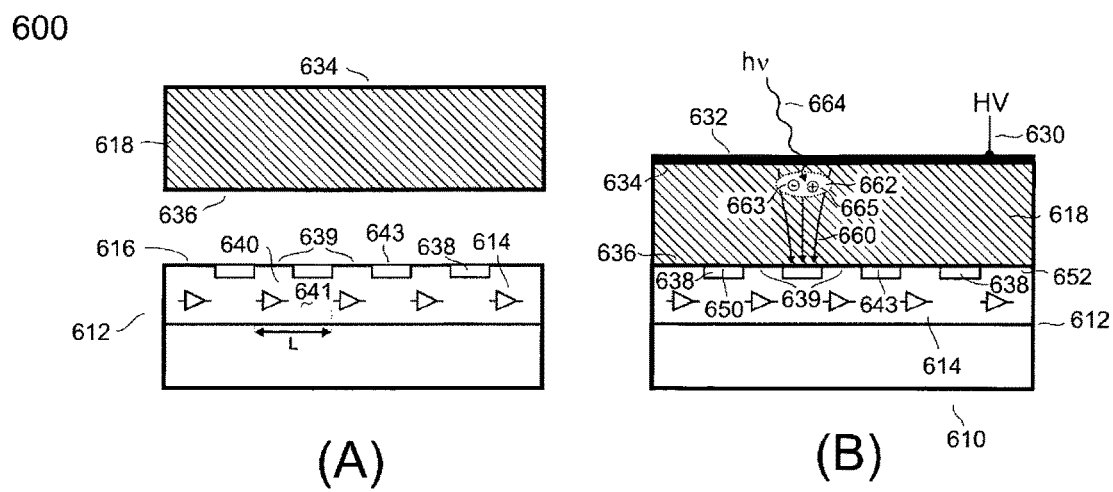
FIG. 7A is a cross-section of a CMOS processed readout wafer and an absorber wafer before bonding to generate a monolithic pixel detector.
FIG. 7B is a cross-section of a monolithic pixel detector comprising an absorber wafer bonded onto a CMOS processed readout wafer.

Referring now to FIG. 7 monolithic pixel detector 610 according to a fifth embodiment 600 may comprise any of the absorber wafer structures 18, 218, 218', 257", 257''', 318, 318', 457, 457', 557, 557' of the previous paragraphs bonded onto CMOS processed wafer 612 containing the readout electronics 614. For the sake of simplicity, a single generic absorber wafer 618 with upper surface 634 and lower surface 636 is shown in FIG. 7A along with CMOS processed wafer 612, before the two wafers are fused in a monolithic block by low temperature wafer bonding. Readout wafer 612 has a front side surface 616 and a backside surface 620. CMOS processed readout electronics is located on front side 616 and may comprise several metallization levels separated by field oxide. The very surface of front side 616 comprises charge collector metal pads 638 serving as charge collector contacts communicating with the transistors of the individual pixel electronics 640 of readout electronics 614, the spacing between charge collector metal pads 638 defining the size L of pixels 641. Charge collector metal pads 638 with surfaces 643 are mutually separated and electrically isolated by oxide regions with surfaces 639. Preferably surfaces 639 and 643 are at the same height level, which may be realized for example by a chemical mechanical polishing step of front side 616 of readout wafer 612. Lower surface 636 of absorber wafer 618 may equally be subjected to chemical mechanical polishing in order to facilitate subsequent bonding onto readout wafer 612.

Bonding of readout wafer 612 onto absorber wafer 618 preferably comprises steps of optional in situ pre-bonding annealing to reduce moisture from wafers 612, 616 before the surface treatment providing oxide-free surfaces suitable for the formation of electrically conducting bonds 650 between surfaces 643 of charge collector metal pads 638 and surface 636 of semiconducting absorber wafer 618. Annealing temperatures may range between 100° C. and 200° C., or between 200° C. and 300° C. The surface treatment required for bonding of readout wafer 612 may include steps from a list of steps for example comprising ex situ wet chemical cleaning; in situ ion bombardment, preferably with ion and neutral particle energies chosen from one of a range of energies comprising 70-100 eV, 50-70 eV and 40-50 eV; or in situ hydrogen plasma activation preferably followed by in situ soft ion bombardment or laser exposure for the removal of hydrogen adsorbed on oxide surfaces 639 or on charge collector metal pads 638. The surface treatment required for bonding of semiconducting absorber wafer 618 may include steps from a list of steps comprising ex situ wet chemical oxide removal and hydrogen passivation for example by a dilute HF dip or exposure to HF vapor, followed by in situ soft ion bombardment or laser exposure for removal of adsorbed H. The preferred method for removal of the hydrogen passivation may be by low energy H or He ions. He ions with energies between about 100-200 eV are known to remove H without any significant recoil implantation (see for example M. R. Tesauro et al. in Surf. Sci. 415, 37 (1998), the entire disclosure of which is hereby incorporated by reference) and much higher energies are required to induce Si amorphization (see for example V. F. Reutov et al, in Techn. Phys. Lett. 28, 615 (2002), the entire disclosure of which is hereby incorporated by reference). Another way for surface oxide removal may be energetic, preferably rare gas or nitrogen particle bombardment (sputtering) for example by charged $Ar^+$, $N_2^+$ or $N^+$ ions or neutral Ar or N atoms or $N_2$ molecules generated for example in a plasma source known in the art. Preferably ion or atom sputtering energies are kept low, for example close to the sputter threshold in order to minimize Si amorphization. Suitable ion and neutral particle energies may range between about 70-100 eV or preferably between about 50-70 eV or even more preferably between about 40-50 eV (see for example S. S. Todorov et al. in Appl. Phys. Lett. 52, 365 (1988), the entire disclosure of which is hereby incorporated by reference).

Bonding of readout wafer 612 onto absorber wafer 618 is preferably carried out at a temperature below 400° C. or more preferably below 300° C. or even more preferably below 200° C. The most desirable bonding temperature is below 100° C. or even room temperature. Thereby oxide-free surfaces 643 of charge collector metal pads 638 of readout wafer 612 are bonded onto oxide-free surface 636 of absorber wafer 618 in electrically conducting metal-semiconductor bond 650. Simultaneously, oxide surfaces 639 of readout wafer 612 are bonded onto oxide-free surface 636 of absorber wafer 618 in oxide-semiconductor bond 652. The bonding may be followed by optional post-bonding anneal. Annealing temperatures may range between 100° C. and 200° C., or between 200° C. and 300° C., or between 300° C. and 400° C. In any case they must be below about 450° C. in order to avoid disintegration of the metallization of CMOS processed wafer 612. FIG. 7B shows the resulting monolithic structure wherein the upper surface 634 of semiconductor wafer 618 has been supplied with metal contact 632. When a high voltage 630 is applied between metal contact 632 and charge collector metal pads 638, absorber wafer 618 may be substantially depleted of mobile charge carriers, resulting in a large electric field 660. As a consequence, electron-hole pairs 662 are generated in absorber wafer 618 by X-ray photons 664 or energetic particles and may be separated by the electric field present therein and travel along electric field lines 660 rather than by diffusive transport. Depending on the sign of voltage 630, electric charges, either electrons 663 or holes 665 may drift along field lines 660 towards charge collector metal pads 638 where they are collected for further signal processing by the individual pixel electronics 640 of readout electronics 614.

The readout electronics of embodiments 200, 200', 200", 200'" and 600 are all understood to communicate with at least one PCB board designed for routing the digital signals generated in the readout electronics for further data processing and display on at least one computer screen either locally or remotely.

Exemplary Applications of the Pixel Detector in Medical, Industrial and Scientific Systems and Methods The pixel detector of the present invention is integrated into and used in methods of the following medical applications, either human or veterinary, and other applications as described below.

Projection Radiography Example

The pixel detector of the invention is used in digital radiography systems and methods, in which the X-rays transmitted through an object are converted into electrical signals generating digital information, which is transmitted and converted into an image displayed on a computer screen either locally or remotely.

There are many disease states in which classic diagnosis is obtained by plain radiographs, in combination with systems and methods incorporating the pixel detector of the present invention. Examples of systems and method include those to diagnose various types of arthritis and pneumonia, bone tumors, fractures, congenital skeletal anomalies, and the like.

Fluoroscopy Example

The monolithic CMOS integrated pixel detector may be used as a replacement of hybrid pixel detectors comprising caesium iodide scintillators communicating with photodetectors. It allows real-time imaging of anatomical structures in motion, and the method is optionally augmented with a radio-contrast agent. Radio-contrast agents are administered by swallowing or injecting into the body of the patient to delineate anatomy, function of the blood vessels and various systems, e.g. the genitor-urinary system or the gastro-intestinal tract. Two radio-contrast agents are presently in common use. Barium sulfate ($BaSO_4$) is administered to the subject orally or rectally for evaluation of the gastro-intestinal tract. Iodine in various formulations is given by oral, rectal, intra-arterial or intravenous pathways. These radio-contrast agents absorb or scatter X-rays, and in conjunction with real-time imaging, permit the imaging of dynamic physiological processes in the digestive tract or blood flow in the vascular system. Iodine contrast agents are also concentrated in abnormal areas in different concentrations than in normal tissues to make abnormalities (e.g. tumors, cysts, inflamed areas) visible.

Interventional Radiology Example

The pixel detector is used in interventional radiology systems and methods. Interventional radiology includes minimally invasive procedures that are guided by imaging systems utilizing systems and methods having the pixel detector described herein. These procedures are diagnostic or involve treatments, e.g., angiography or angioplasty, and the systems used therewith. Exemplary systems include those systems to diagnose and/or treat peripheral vascular disease, renal artery stenosis, inferior vena cava filter placement, gastrostomy tube placement, biliary stent intervention, and hepatic intervention. Non-angiographic procedures such as image guided orthopedic, thoracic, abdominal, head and neck, and neuro surgery, biopsies, brachytherapy or external beam radiotherapy, percutaneous drain and stent placement or radiofrequency ablation are also included. Images created with the assistance of the systems utilizing the pixel detector are used for guidance. The images created with the assistance of the pixel detector provide maps that permit the interventional radiologist to guide instruments through the body of a subject to the areas containing disease conditions. These systems and methods minimize the physical tissue trauma to the subject, reduce infection rates, recovery times, and hospitalization stays.

Computed Tomography ("CT") Example

The pixel detector is used in CT systems and methods. CT generated images use X-rays in conjunction with computing software to image body structures and tissues. In CT used with the pixel detector of the invention, an X-ray tube opposite one or more X-ray detectors in a ring-shaped apparatus rotate around a subject that produces a computer-generated cross-sectional image, e.g. a tomogram. In one variant of the invention, CT images harvested with the system and method utilizing a pixel detector of the invention are acquired in an axial plane, with coronal and sagittal images produced by computer software reconstruction. Optionally, radio-contrast agents are used with CT for enhanced visualization of anatomical structures. CT used with the pixel detector of the invention detects subtle variations in the attenuation of X-rays.

In one variant of the invention, a spiral multi-detector CT uses 16, 64, 254 or more detectors during a method with a system that provides continuous movement of the subject through the radiation beam to obtain fine detail images in a short examination period of time. Using rapid administration of intravenous contrast during the CT scan with a system and method of the invention, fine detail images are reconstructed into three-dimensional (3D) images of carotid, cerebral, coronary or other arteries, by way of example, and also other patient tissues.

As such, CT with a system and method of the invention is ideal for diagnosing critical and emerging conditions, e.g. cerebral hemorrhage, pulmonary embolism, aortic dissection, appendicitis, diverticulitis, and obstructive kidney stones.

Mammography Example

The pixel detector described herein is used in mammography systems and methods. Mammography is the radiographic examination of the female breast utilizing low energy X-rays and fine detail film-screen and/or digital imaging to create mammograms. Mammograms are used in screening examination methods that are directed to detect early breast cancer formations or for diagnostic study so as to better define abnormalities discovered during a screening procedure, for follow-up regarding a previously discovered abnormality or to evaluate a palpable mass in the breast.

In one variant of the method used with the pixel detector and systems and methods used herein, two views of each breast, e.g. cranial-caudal ("CC"), and medial-lateral-oblique ("MLO") are obtained using the systems and methods utilizing the pixel detection of the invention while the female breast is compressed. In yet another variant of the invention, the pixel detector is used in full field digital imaging systems and methods.

Dental Radiography Example

The pixel detector is used in systems and methods for dental radiography. Dental radiography systems and methods incorporating the pixel detector of the present invention are utilized to find hidden dental abnormal structures, malignant or benign masses of tissues, bone loss, and tooth cavities. The radiographic image is formed by a controlled burst of X-ray radiation which penetrates the subject's oral structures at different levels, depending on varying anatomical densities of the structures, before striking the sensor. By way of example, less radiation penetrates teeth which therefore yield less intensity on the digital radiograph: By contrast, dental caries, infections and other changes in the bone density, and the periodontal ligament, appear more intense on the radiograph because X-rays readily penetrate these less dense structures. Dental restoration structures, e.g. fillings and crowns, yield more or less intensity, depending on the density of the material. The pixel detector of the invention furthermore delivers enhanced contrast by its ability to resolve the energy of incident X-rays, which by nature is material dependent. Digital dental X-ray systems and methods, are used with the pixel detector of the invention in dentistry in another variant of the invention.

Transmission Electron Microscopy and Secondary Electron Microscopy Example

The pixel detector may be used in systems and methods for transmission electron microscopy (see for example M. Battaglia et al., in Nucl. Instr. Meth. Phys. Res. A 622, 669 (2010)). For example the pixelated absorber of the invention comprising small absorber patches and thinned drift region of the readout wafer may give rise to exceptionally high spatial resolution due to reduced backscattering of electrons in the absorber patches. The resolution of the pixel detector of the invention may be as high as 5-20 μm or even 1-5 μm. Similar advantages apply to Secondary Electron Microscopy (SEM). In both cases the single-photon detection capability of the pixel detector of the invention may be used also for energy discrimination by a pulse height analysis of electrons or photons generated by electron impact in the investigated material.

Mass Spectrometry Imaging Example

The pixel detector may be used in systems and methods for mass spectrometry imaging (MSI). There are two different approaches for MSI: (1) secondary ion mass spectrometry (SIMS) that uses a charged primary ion beam for ionization and (2) matrix-assisted laser desorption-ionization (MALDI) that uses a focused laser light source. Both modes may use pixel detectors. For microscope mode SIMS, see for example A. Kiss et al. in Rev. Sci. Instrum. 84 (2013). For MALDI, see for example J. H. Jungmann et al., in J. Am. Soc. Mass Spectrom. 21, 2023 (2010). For example the pixelated absorber of the invention comprising small absorber patches and thinned drift region of the readout wafer may give rise to exceptionally high spatial resolution due to reduced backscattering in the absorber patches. The resolution of the pixel detector of the invention may be as high as 5-20 μm or even 1-5 μm.

Elementary Particle Example

The pixel detector may be used in systems and methods for elementary particle detection and imaging. The pixel detector of the invention may be easier and cheaper to scale to large area detectors or even flat panel detectors than approaches requiring through-silicon vias (TSVs), see for example D. Henry et al. in Proc. Electronics Components and Technology Conference 2013, pp. 568). The pixel detector of the invention also offers the advantage of higher resistivity absorber layers, facilitating full carrier depletion at moderate applied voltages of for example 100-500 V or 50-100 V even for higher absorber layer thicknesses of for example 30 to 100 μm or 100 to 500 μm or 500 to 2000 μm, in comparison with monolithic detectors fabricated without the bonding of highly resistive absorber wafers (see for example P. Giubilato et al. in Nucl. Instr. Meth. Phys. Res. A 732, 91 (2013)).

Non-Destructive Testing Example

The pixel detector may be used in systems and methods for non-destructive testing for example in a computed tomography (CT) setup (see for example S. Procz et al. in JINST 8, C01025 (2013)). The pixel detector of the invention also offers the advantage of easier and cheaper scalability to large size simplifying a CT setup. The pixel detector of the invention may also be used in digital radiography for security inspection for example because of higher sensitivity in comparison to amorphous-Se based flat panel detectors (see for example S. Kasap et al. in Sensors 11, 5112 (2011)).

The following US patent documents, foreign patent documents, and Additional Publications are incorporated herein by reference thereto, as if fully set forth herein, and relied upon:

US Patent Documents

| | | | |
|---|---|---|---|
| 6,787,885 | B2 | September 2004 | Esser et al. |
| 8,237,126 | B2 | August 2012 | von Känel et al. |
| 5,712,484 | | January 1998 | Harada et al. |

Other Patent Documents

| | | | |
|---|---|---|---|
| EP0571135 | A2 | November 1993 | Collins et al. |
| WO02/067271 | A2 | August 2002 | Ruzin |
| EP1691422 | A1 | August 2006 | Yasuda et al. |
| WO2011/135432 | A1 | November 2011 | von Känel et al. |

Additional Publications http://medipix.web.cern.ch http://www.canberra.com/products/detectors/germanium-detectors.asp http://www.dectris.ch http://www.healthcare.philips.com/

Åberg I. et al., "A low dark current and high quantum efficiency monolithic germanium-on-silicon CMOS imager technology for day and night imaging applications", International Electron Devices Meeting (IEDM), San Francisco, 2010

Alig R. C. et al., "Scattering by ionization and phonon emission in semiconductors", Physical Review B 22, 5565 (1980)

Alig R. C. "Scattering by ionization and phonon emission in semiconductors. II. Monte Carlo calculations", Physical Review B 27, 968 (1983)

Battaglia M. et al., "Characterisation of a CMOS active pixel sensor for use in the TEAM microscope", Nucl. Instr. Meth. Phys. Res. A 622, 669 (2010)

Colace L. et al., "Low Dark-Current Germanium-on-Silicon Near-Infrared Detectors", IEEE Photonics Technology Letters 19, 1813-1815 (2007)

Del Sordo S. et al., "Progress in the Development of CdTe and CdZnTe Semiconductor Radiation Detectors for Astrophysical and Medical Applications", Sensors 2009, 9, 3491-3526

Falub C. V. et al., "Perfect crystals grown from imperfect interfaces", Scientific Reports 3, 2276 (2013)

Flötgen C. et al., "Novel surface preparation methods for covalent and conductive bonded interfaces fabrication", ECS Transactions 64, 103-110 (2014)

Giubilato P. et al., "LePix—A high resistivity, fully depleted monolithic pixel detector", Nucl. Instr. Meth. Phys. Res. A 732, 91 (2013)

Henry D. et al., "TSV Last for Hybrid Pixel Detectors: Application to Particle Physics and Imaging Experiments", in IEEE Electronic Components & Technology Conference, 568 (2013)

Jungmann J. H. et al., "Fast, High Resolution Mass Spectrometry Imaging Using a Medipix Pixelated Detector", J Am Soc Mass Spectrom 21, 2023-2030 (2010)

Kasap S. et al., "Amorphous and polycrystalline photoconductors for direct conversion flat panel X-ray image sensors", Sensors 11, 5112-5157 (2011)

Kiss A. et al., "Microscope mode secondary ion mass spectrometry imaging with a Timepix detector", Rev. Sci. Instrum. 84, 013704 (2013)

Klaassen E. H. et al., "Silicon fusion bonding and deep reactive ion etching: a new technology for microstructures", Sensors and Actuators A52, 132-139 (1996)

Kreiliger T. et al., "Individual heterojunctions of 3D germanium crystals on silicon CMOS for monolithically integrated X-ray detector", Physica Status Solidi A 211, 131-135 (2014)

Li X. et al., "Deep reactive ion etching of pyrex glass using $SF_6$ plasma", Sensors and Actuators A87, 139-145 (2001)

Mattiazzo S. et al., "LePIX: First results from a novel monolithic pixel sensor", Nuclear Instruments and Methods in Physics Research A 718, 288-291 (2013)

Procz S. et al., "Medipix3 CT for material sciences", JINST, 8 C01025 (2013)

Reutov V. F. et al., "Helium ion bombardment induced amorphization of silicon crystals", Technical Physics Letters, 28, 615-617 (2002)

Salvalaglio M. et al., "Fine control of plastic and elastic relaxation in Ge/Si vertical heterostructures", Journal of Applied Physics 116, 104306 (2014)

Tesauro M. R. et al., "Removal of hydrogen from 2H::Si (100) by sputtering and recoil implantation:: investigation of an RPCVD growth mechanism", Surface Science, 415, 37 (1998)

Todorov S. S. et al., "Sputtering of silicon dioxide near threshold", Appl. Phys. Lett. 52 (5), 365 (1988)

Veale, M. C. et al., "Chromium compensated gallium arsenide detectors for X-ray and γ-ray spectroscopic imaging", Nucl Instr. Meth. Phys. Res, A 752, 6 (2014)

Weber J. et al., "Near-band-gap photoluminescence of Si—Ge alloys", Physical Review B 40, 5683-5693 (1989)

The patents and articles mentioned above are hereby incorporated by reference herein, unless otherwise noted, to the extent that the same are not inconsistent with this disclosure.

Other characteristics and modes of execution of the invention are described in the appended claims.

Further, the invention should be considered as comprising all possible combinations of every feature described in the instant specification, appended claims, and/or drawing figures which may be considered new, inventive and industrially applicable.

Multiple variations and modifications are possible in the embodiments of the invention described here. Although certain illustrative embodiments of the invention have been shown and described here, a wide range of modifications, changes, and substitutions is contemplated in the foregoing disclosure. While the above description contains many specifics, these should not be construed as limitations on the scope of the invention, but rather as exemplifications of one or another preferred embodiment thereof. In some instances, some features of the present invention may be employed without a corresponding use of the other features. Accordingly, it is appropriate that the foregoing description be construed broadly and understood as being given by way of illustration and example only, the spirit and scope of the invention being limited only by the claims which ultimately issue in this application.

I claim:

1. A monolithic CMOS integrated pixel detector for the detection of energetic mass and massless particles, comprising
   a) a silicon wafer having a front side comprising a CMOS processed readout electronics and a backside opposite the front side, comprising a thin drift region;
   b) charge collectors in a silicon wafer communicating with the readout electronics and defining detector pixels of size L; and,
   c) an absorber wafer made from at least one single crystal absorber chosen from a list of single crystal absorbers, comprising a single crystal wafer and an epitaxial absorber layer on a thin silicon substrate, said absorber wafer having a metallized back contact,
   wherein the silicon wafer and the absorber wafer form a monolithic unit comprising an oxide-free, electrically conducting covalent wafer bond between the backside of said silicon wafer and a surface of said absorber wafer opposite to said back contact; and wherein the charge collectors are disposed to receive electrical charges when generated by energetic particles incident on the back contact of the absorber wafer; and wherein the readout electronics is disposed to convert said electrical charges into digital signals which can be stored, processed and displayed as images on a computer screen.

2. The pixel detector of claim 1, wherein said readout electronics and said absorber wafer are adapted for the detection of single particles from a list of particles, comprising:
   a) photons; and
   b) elementary particles carrying a mass.

3. The pixel detector of claim 1, wherein the pixel size comprises a size within a range of a list of ranges, comprising 100-200 μm, 50-100 μm, 20-50 μm and 5-25 μm.

4. The pixel detector of claim 1, wherein said thin drift region of said silicon wafer, is disposed to be traversed by electrical charges when generated by energetic particles incident on the metallized back contact of the absorber wafer, and wherein the charge collectors are disposed to receive said electrical charges having traversed the drift region and letting the charges to be converted into digital signals by the readout electronics which can be stored, processed and displayed as images on a computer screen.

5. The pixel detector of claim 1, wherein the thin drift region of said silicon wafer as a thickness of 10-100 μm.

6. The pixel detector of claim 1, wherein the thin drift region of said silicon wafer has a thickness of 10-20 μm.

7. The pixel detector of claim 1, wherein the thermal strain induced by temperature changes because of the mismatch of the thermal expansion coefficients of said absorber and said Si wafer is below $10^{-3}$.

8. The pixel detector of claim 7, wherein the thermal strain induced by temperature changes because of the mismatch of the thermal expansion coefficients of said absorber wafer and said Si wafer is below $10^{-4}$.

9. The pixel detector of claim 1, wherein the absorber wafer is bonded by the electrically conducting direct wafer bond to the backside surface of said Si wafer, said absorber wafer is pixelated in the form of absorber patches with sidewalls separated by trenches, and said Si wafer comprises said CMOS processed readout electronics on the front side thereof.

10. The pixel detector of claim 9, wherein the absorber patches comprise a width chosen from a list of ranges comprising 200-500 μm, 100-200 μm, 50-100 μm, 20-50 μm, 5-20 μm and 1-5 μm.

11. The pixel detector of claim 9, wherein the trenches comprise a width chosen from a list of ranges comprising 1-5 μm, 0.1-1 μm, 100 nm-1 μm, and 20 nm-100 nm.

12. The pixel detector of claim 9, wherein the sidewalls of the absorber patches are passivated by at least one dielectric layer.

13. The pixel detector of claim 1, wherein the surface of the thin silicon substrate with the epitaxial absorber layer is bonded by the oxide-free, electrically conducting covalent wafer bond to the backside surface of the Si wafer, comprising said CMOS processed readout electronics on the front side thereof.

14. The pixel detector of claim 13, wherein said epitaxial absorber layer comprises distinct patches with a width within a range selected from one of a list of ranges, consisting of 50-100 μm, 20-50 μm, 5-20 μm and 1-5 μm, and with sidewalls separated by trenches.

15. The pixel detector of claim 14, wherein said trenches comprise a width within a range of a list of ranges, comprising 1-5 μm and 0.1-1 μm.

16. The pixel detector of claim 14, wherein said trenches comprise a width within a range of a list of ranges, comprising 100 nm-1 μm and 20 nm-100 nm.

17. The pixel detector of claim 14, wherein the sidewalls of distinct absorber patches are passivated by at least one dielectric layer.

18. The pixel detector of claim 13, wherein the silicon substrate has a thickness of 10-100 μm.

19. The pixel detector of claim 13, wherein the silicon substrate has a thickness of 10-20 μm.

20. The pixel detector of claim 1, wherein said thin silicon substrate comprises an offcut from the exact on-axis wafer orientation chosen from a list of offcut angles comprising 2°-4° and 4°-6°.

21. The pixel detector of claim 1, wherein said thin silicon substrate comprises a thickness chosen from a list of thickness ranges, comprising 10-100 μm, 10-50 μm and 10-20 μm.

22. The pixel detector of claim 1, wherein said epitaxial absorber layer comprises a compositionally graded $Si_{1-x}Ge_x$ alloy, and wherein the Ge content is above 20%.

23. The pixel detector of claim 22, wherein the grading rate comprises a range taken from a list of ranges comprising 2-3%, 1-2% and 0.5 to 1%.

24. The pixel detector of claim 1, wherein said epitaxial absorber layer comprises a compositionally graded $Si_{1-x}Ge_x$ alloy, and wherein the final Ge content is in the range of about $0.6 \leq x \leq 0.8$.

25. The pixel detector of claim 24, wherein the grading rate comprises a range taken from a list of ranges comprising 2-3%, 1-2% and 0.5 to 1%.

26. A system for radiography comprising the pixel detector of claim 1.

27. The system for radiography of claim 26 in which the pixel detector is selected from the group consisting of a diagnostic pixel detector and a therapeutic pixel detector.

28. The system of radiography of claim 26 in which the pixel detector is selected from the group consisting of a projection radiography adapted pixel detector, a fluoroscopy adapted pixel detector, an interventional radiography adapted pixel detector, a CT adapted pixel detector, and a mammography adapted pixel detector, a dental radiography adapted pixel detector.

29. A method of radiography comprising imaging with the system of claim 26.

30. The method of radiography of claim 29 in which the pixel detector is selected from the group consisting of a projection radiography adapted pixel detector, a fluoroscopy adapted pixel detector, an interventional radiography adapted pixel detector, a CT adapted pixel detector, a mammography adapted pixel detector, and a dental radiography adapted pixel detector.

31. A system for transmission electron microscopy and secondary electron microscopy comprising the pixel detector of claim 1.

32. The system of claim 31, wherein the pixel detector is selected from a group of exceptionally high spatial resolution detectors.

33. A system for mass spectrometry imaging comprising the pixel detector of claim 1.

34. The system of claim 33, wherein the pixel detector is selected from the group comprising pixel detectors adapted for secondary ion mass spectrometry (SIMS) and pixel detectors adapted for mass spectrometry using matrix-assisted laser desorption-ionization (MALDI) with a focused laser light source.

35. A system for elementary particle detection and imaging comprising the pixel detector of claim 1.

36. The system of claim 35, wherein the pixel detector is adapted to high resistivity absorber layers for the pixel detector of the invention also offers the advantage of higher resistivity absorber layers, facilitating full carrier depletion at moderate applied voltages even for larger thicknesses of the absorber layer.

37. A system for non-destructive testing comprising the pixel detector of claim 1.

38. The system of claim 37, wherein the pixel detector is selected from the group of a computed tomography setup adapted pixel detector and a digital radiography for security inspection adapted pixel detector.

39. The pixel detector of claim 1, wherein said absorber wafer comprises at least one semiconductor material chosen from a list of materials, comprising Si, Ge, a $Si_{1-x}Ge_x$ alloy, GaP, GaAs, CdTe, and a $Cd_{1-x}Zn_xTe$ alloy.

40. A method for forming a monolithic CMOS integrated pixel detector, the method comprising steps of:
   a) providing a silicon wafer with a front side and a backside opposite the front side;
   b) providing a readout electronics on the front side of the silicon wafer by CMOS processing the silicon wafer;
   c) disposing charge collectors to communicate with the readout electronics and defining detector pixels on the front side of the silicon wafer;
   d) planarizing the surface of the CMOS processed silicon wafer by chemical mechanical polishing;
   e) bonding a handling wafer to the surface of the planarized CMOS processed wafer;
   f) thinning the backside of the silicon wafer by grinding and chemical mechanical polishing to provide a thinned planarized silicon wafer with a thin drift region;
   g) providing at least one absorber wafer from a list of absorber wafers, comprising single crystal absorber wafers and epitaxial absorber wafers with an epitaxial absorber layer on a silicon substrate;
   h) if the absorber wafer is an epitaxial absorber wafer, thinning the silicon substrate to provide a thin silicon substrate;
   i) a forming a metallized back contact on the absorber wafer; and
   j) providing a monolithic unit from said thinned silicon wafer and said absorber wafer by forming an oxide-free, electrically conducting covalent wafer bond between the backside of the thinned silicon wafer and said absorber wafer in a low temperature covalent wafer bonding process disposed to let the charge collectors receive electrical charges when generated by energetic particles incident on the back contact of the absorber wafer to be converted into digital signals in the readout electronics and stored, processed and displayed as images on a computer screen.

41. The method of claim 40, wherein the oxide-free, electrically conducting covalent wafer bond between the backside of the thinned silicon wafer and said absorber wafer is formed at a low temperature chosen below one of a list of temperatures, comprising 400° C., 300° C., 200° C. and 100° C.

42. The method of claim 41, wherein said electrically conducting wafer bond between the backside surface of the thinned silicon wafer and said absorber wafer is provided by removing the oxide on the backside surface of the thinned silicon wafer and the surface of said absorber wafer before forming the direct low temperature wafer bond by steps from a list of steps, comprising:
   a) performing a dilute HF dip and hydrogen passivating the surfaces;
   b) exposing to HF vapor and hydrogen passivating the surfaces;

c) sputtering the surfaces by energetic particle bombardment; and
d) activating the surfaces by a hydrogen plasma.

43. The method of claim 42, wherein the hydrogen passivation of is removed, the hydrogen removal comprising steps from a list of steps, comprising
c) exposing the surfaces to a laser;
d) exposing the surfaces to low energy H ions; and
e) exposing the surfaces to low energy He ions.

44. The method of claim 43, wherein the low energy H and He ions is chosen within a range of energies comprising 100-200 eV.

45. The method of claim 42, wherein removing the oxide on the surfaces comprises steps from a list of steps, comprising:
a) providing a plasma source providing energetic ions and neutral particles from a list comprising:
   i) $Ar^+$, $N_2^+$, and $N^+$ ions;
   ii) Ar and N atoms;
   iii) $N_2$ molecules; and
b) providing said energetic ions and neutral particles with energies within a range of energies from a list of ranges, comprising 70-100 eV, 50-70 eV and 40-50 eV.

46. The method of claim 40, wherein the thinning of the silicon wafer provides the drift region with a thickness of 10-100 μm.

47. The method of claim 46, wherein the thinning of the silicon wafer provides the drift region with a thickness of 10-20 μm.

48. The method of claim 40, wherein forming said monolithic unit comprises steps of
a) forming an absorber wafer by performing steps from a list of steps comprising
   i) providing a silicon substrate;
   ii) growing an epitaxial absorber layer on the silicon substrate;
   iii) planarizing the surface of the epitaxial absorber layer by chemical mechanical polishing;
   iv) bonding a handling wafer to the surface of the planarized epitaxial absorber layer;
   v) thinning the substrate to a thickness range from a list of thickness ranges comprising:
      i) 10-100 μm; and
      ii) 10-20 μm;
b) bonding the thinned substrate of the absorber wafer to the backside surface of a thinned silicon wafer in a low temperature oxide-free, electrically conducting covalent wafer bond; and
c) removing the handling wafer from the surface of the planarized epitaxial absorber layer.

49. The method of claim 48, wherein growing said epitaxial absorber layer comprises growing the epitaxial layer in the form of a compositionally graded $Si_{1-x}Ge_x$ alloy layer with a Ge content above 20%.

50. The method of claim 49, wherein growing said compositionally graded $Si_{1-x}Ge_x$ alloy layer comprises choosing the range of grading rate from a list of ranges of grading rates, comprising 2-3%, 1-2% and 0.5 to 1%.

51. The method of claim 49, wherein growing said epitaxial absorber layer comprises growing the epitaxial layer in the form of distinct absorber patches comprising a width within a range of a list of ranges, comprising 50-100 μm, 20-50 μm, 5-20 μm and 1-5 μm, and wherein the absorber patches are separated by trenches of a width within a range of a list of ranges, comprising 100 nm-1 μm and 20 nm-100 nm.

52. The method of claim 48, wherein growing said epitaxial absorber layer comprises growing the epitaxial absorber layer in the form of a compositionally graded $Si_{1-x}Ge_x$ alloy layer with a final Ge content in the range of about $0.6 \leq x \leq 0.8$.

53. The method of claim 40, wherein forming said monolithic unit comprises steps of:
a) forming an absorber wafer by performing steps from a list of steps, comprising
   i) providing a silicon substrate; and
   ii) growing an epitaxial absorber layer on the silicon substrate;
b) planarizing the surface of the epitaxial absorber layer by chemical mechanical polishing;
c) bonding the surface of the epitaxial absorber layer to the backside surface of said silicon wafer in a low temperature oxide-free, electrically conducting covalent wafer bond;
d) removing the silicon substrate to form a thinned absorber wafer; and
e) metallizing the surface of the thinned absorber wafer.

54. The method of claim 40, wherein providing said monolithic unit comprises steps of:
a) providing a patterned substrate; and
b) providing an epitaxial absorber wafer by epitaxially growing an absorber layer onto the patterned substrate in the form of distinct absorber patches separated by trenches.

55. The method of claim 54, wherein providing said absorber wafer comprises providing said absorber patches with a width within a range of widths comprising 200-500 μm, 100-200 μm and 20-50 μm, and providing said trenches with a width within a range of widths comprising 1-5 μm and 0.1-1 μm.

56. The method of claim 54, characterized by passivating the sidewalls of said distinct absorber patches by a dielectric layer.

57. The method of claim 54, wherein providing said monolithic unit comprises steps of:
a) filling the trenches between distinct absorber patches with a dielectric;
b) planarizing the surface of the epitaxial absorber layer by chemical mechanical polishing;
c) bonding a handling wafer to the surface of the planarized epitaxial absorber layer;
d) thinning the substrate to a thickness range from a list of thickness ranges comprising 10-100 μm and 10-20 μm;
e) bonding the thinned substrate of the absorber wafer to the backside surface of a thinned silicon wafer in a low temperature oxide-free, electrically conducting covalent wafer bond; and
f) removing the handling wafer from the surface of the planarized epitaxial absorber layer.

58. The method of claim 54, wherein providing said monolithic unit comprises steps of:
a) filling the trenches between distinct absorber patches with a dielectric;
b) planarizing the surface of the epitaxial absorber layer by chemical mechanical polishing;
c) bonding the planarized surface of the epitaxial absorber layer to the backside surface of said silicon wafer in a low temperature oxide-free, electrically conducting covalent wafer bond;
d) removing the substrate to form a thinned absorber wafer; and
e) metallizing the surface of the thinned absorber wafer.

59. The method of claim 58, wherein growing said epitaxial absorber layer comprises growing the epitaxial layer in the form of a $Si_{1-x}Ge_x$ alloy layer with a Ge content above 20%.

60. The method of claim 58, wherein growing said epitaxial absorber layer comprises growing the epitaxial absorber layer in the form of a $Si_{1-x}Ge_x$ alloy layer with a Ge content in the range of about $0.6 \leq x \leq 0.8$.

61. The method of claim 40, wherein said absorber wafer comprises at least one semiconductor material chosen from a list of materials, comprising Si, Ge, a $Si_{1-x}Ge_x$ alloy, GaP, GaAs, CdTe, and a $Cd_{1-x}Zn_x Te$ alloy.

* * * * *

UNITED STATES PATENT AND TRADEMARK OFFICE
CERTIFICATE OF CORRECTION

PATENT NO. : 10,163,957 B2
APPLICATION NO. : 15/537451
DATED : December 25, 2018
INVENTOR(S) : Hans Von Känel Page 1 of 1

It is certified that error appears in the above-identified patent and that said Letters Patent is hereby corrected as shown below:

On the Title Page

In item (74) Attorney, Agent, or Firm section, replace "Da Vinco Partners LLC" with --Da Vinci Partners LLC--.

In the Claims

In Column 34, Line 38, replace the phrase "i) a forming a metallized back contact" with the phrase --i) forming a metallized back contact--.

In Column 35, Line 5, replace the phrase "passivation of is removed" with the phrase --passivation is removed--.

In Column 35, Line 7, replace the bullet points "c) d) e)" with the bullet points --a) b) c)--.

Signed and Sealed this
Thirtieth Day of April, 2019

Andrei Iancu
*Director of the United States Patent and Trademark Office*